United States Patent
Lin et al.

(10) Patent No.: US 8,509,003 B2
(45) Date of Patent: Aug. 13, 2013

(54) READ ARCHITECTURE FOR MRAM

(75) Inventors: Kai-Chun Lin, Hsinchu (TW);
Hung-Chang Yu, Hsin-Chu (TW);
Yue-Der Chih, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 66 days.

(21) Appl. No.: 13/237,282

(22) Filed: Sep. 20, 2011

(65) Prior Publication Data
US 2013/0070519 A1    Mar. 21, 2013

(51) Int. Cl.
*G11C 16/06* (2006.01)
*G11C 11/56* (2006.01)

(52) U.S. Cl.
CPC .................................. *G11C 11/5642* (2013.01)
USPC ............... 365/185.21; 365/185.2; 365/210.1; 365/196; 365/207; 365/185.03

(58) Field of Classification Search
CPC ............... G11C 11/5642; G11C 2211/5634; G11C 2211/5621; G11C 13/004
USPC ............... 365/185.03, 185.21, 185.2, 210.1, 365/196, 207
See application file for complete search history.

(56) References Cited

U.S. PATENT DOCUMENTS
2006/0083052 A1 * 4/2006 Kang et al. .................... 365/154

OTHER PUBLICATIONS

Huai, Y., "Spin-Transfer Torque MRAM (STT-MRAM): Challenges and Prospects", AAPPS Bulletin, Dec. 2008, 18(6):33-40.
Chen, Y. et al., "A Nondestructive Self-Reference Scheme for Spin-Transfer Torque Random Access Memory (STT-RAM)", Design, Automation & Test in Europe Conference & Exhibition, 2010, pp. 148-153.
Tabrizi, F., "STT-RAM: Advantages & Applications", Grandis, Inc., Flash Memory Summit, Aug. 2010, 21 pages.

* cited by examiner

*Primary Examiner* — Thong Q Le
(74) *Attorney, Agent, or Firm* — Duane Morris LLP

(57) ABSTRACT

A read architecture for reading random access memory (RAM) cells includes a multi-level sense amplifier, the multi-level sense amplifier including a plurality of sense amplifiers, each sense amplifier having a respective sense threshold and a respective sense output, and a storage module coupled to the multi-level sense amplifier for storing the sense outputs of the multi-level sense amplifier. The storage module stores a first set of sense outputs corresponding to a first read of an RAM cell and stores a second set of sense outputs corresponding to a second read of the RAM cell. The architecture also includes a decision module for comparing the first and second set of sense outputs and determining a data state of the RAM cell based on the comparison.

23 Claims, 19 Drawing Sheets

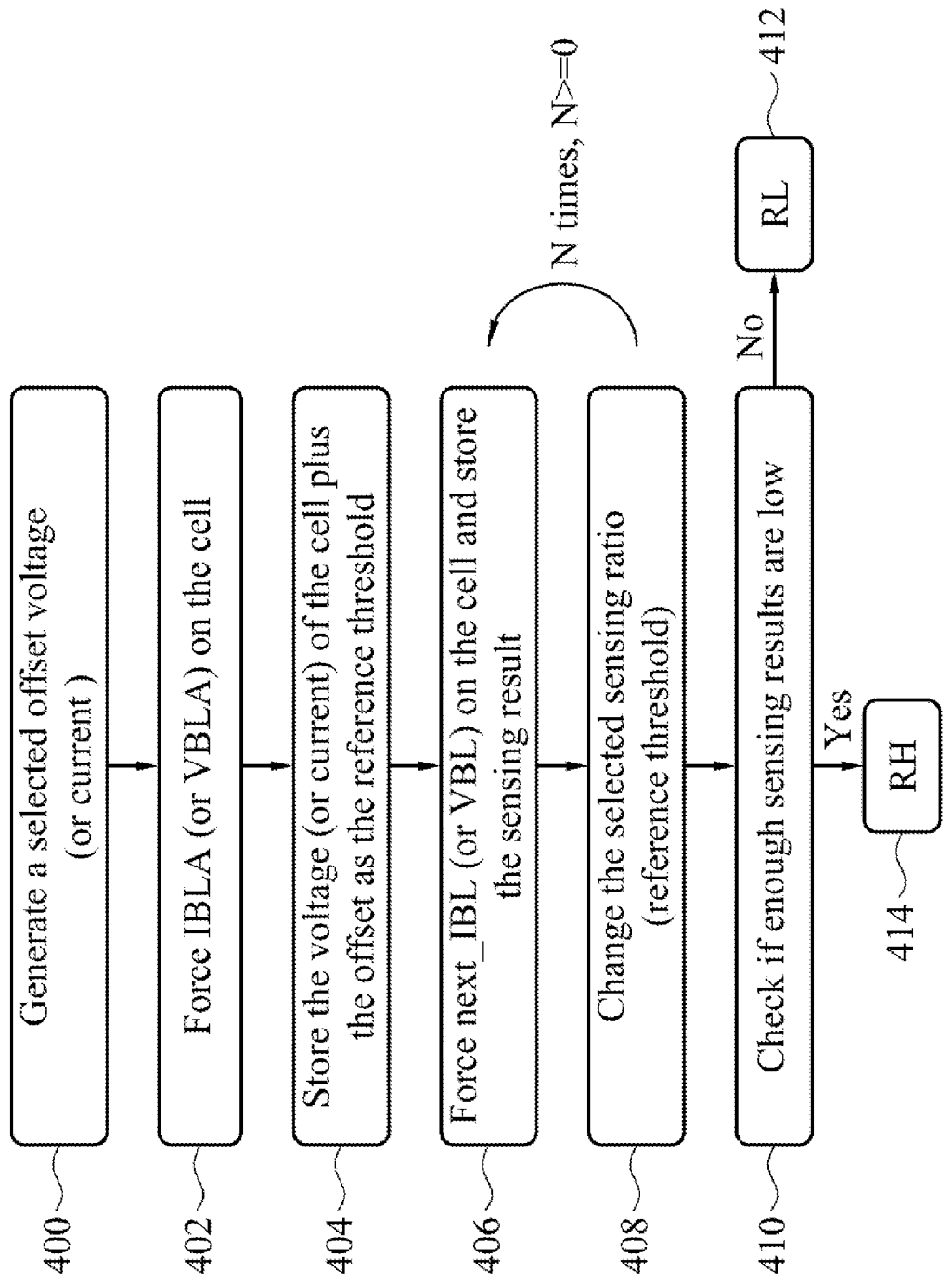

READ ARCHITECTURE FOR MRAM

TECHNICAL FIELD

The present disclosure relates to read architectures for memory devices, and more specifically to reach architectures for magnetoresistive random access memory (MRAM).

BACKGROUND

Magnetoresistive random access memory (MRAM) is a non-volatile memory where data is stored in magnetic storage elements. In simple configurations, each cell has two ferromagnetic plates, each of which can hold a magnetic field, separated by a thin insulating layer. One of the plates is a permanent magnet set to a selected polarity and the other plate's field can be changed to match that of an external field to store a bit. Depending upon the field, the cell is either in the low (RL) resistive state, which may represent a logic "1", or the high (RH) resistive state, which may represent a logic "0".

Due to process variations, individual MRAM cells in an array can have different RH values (when programmed at RH) and different RL values (when programmed at RL). FIG. 1 is a graph illustrating the distribution or count of high resistance (RH) and low resistance (RL) value across an array of MRAM cells. Process variations can result in an overlap in the resistance values for the high (RH) and low (RL) states, which can lead to read errors. This overlap is defined between RHmin and RLmax. Conventional sense amplifiers cannot account for these process variations.

BRIEF DESCRIPTION OF THE DRAWINGS

FIG. 14 is a flow diagram describing the alternative embodiment of a non-destructive read method of FIG. 13.

DETAILED DESCRIPTION

This description of the exemplary embodiments is intended to be read in connection with the accompanying drawings, which are to be considered part of the entire written description. In the description, terms concerning coupling and the like, such as "coupled", "connected" and "interconnected," refer to a relationship wherein structures communicate with one another either directly or indirectly through intervening structures unless expressly described otherwise.

Embodiments of a multi-level current sense amplifier are described herein for determining if a MRAM cell being read is programmed to a RH or RL value. In some embodiments, the MRAM cell is a Spin-Transfer-Torque (STT) MRAM. STT MRAM uses spin-aligned or polarized electron flow to turn the free magnetic layer with respect to the pinned magnetic layer. When the polarizations of the layers are parallel, the result is the low (RL) resistive state, which may represent a logic "1". When the polarizations of the layers are anti-parallel, the result is the high (RH) resistive state, which may represent a logic "0". Overall, the STT MRAM requires much less write current than conventional or toggle MRAM.

Figure 1:
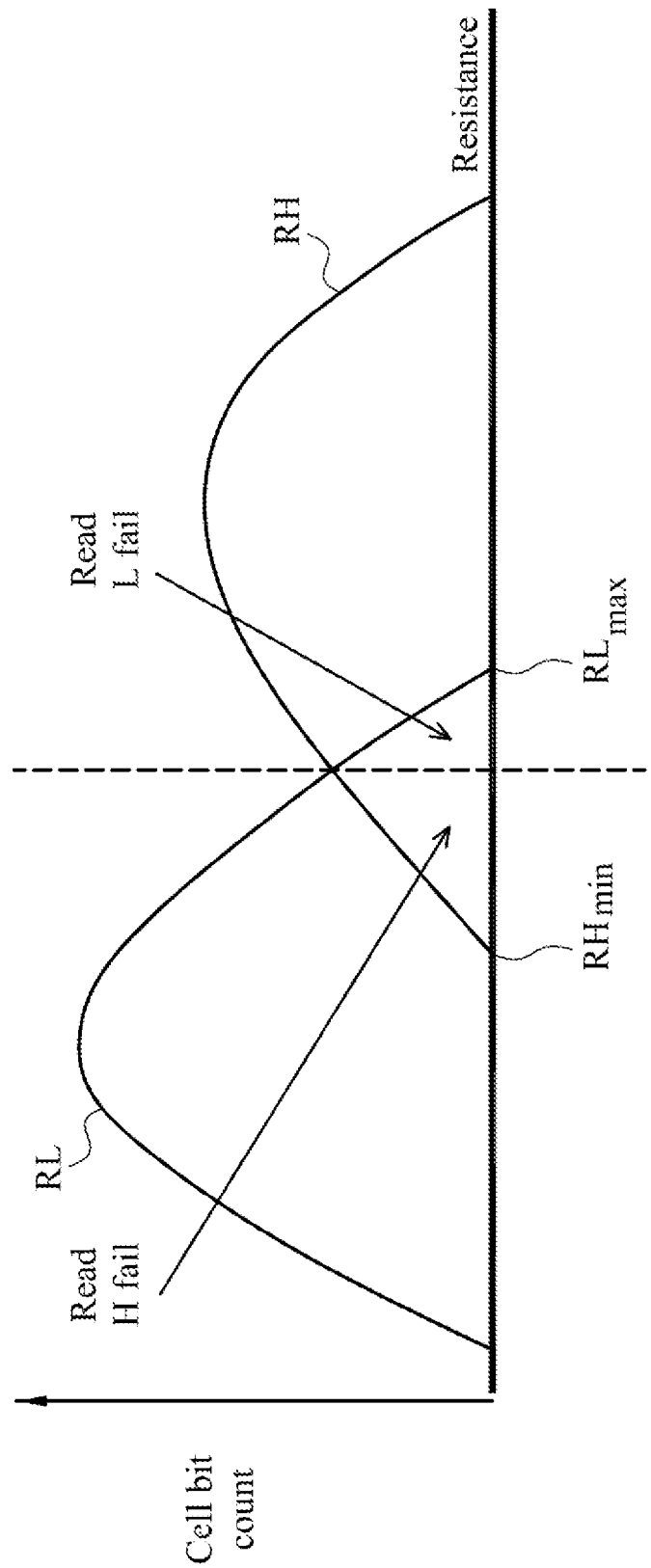
FIG. 1 is a graph illustrating the high and low resistance distribution for MRAM cells in an array due to process variations.
Figure 2:
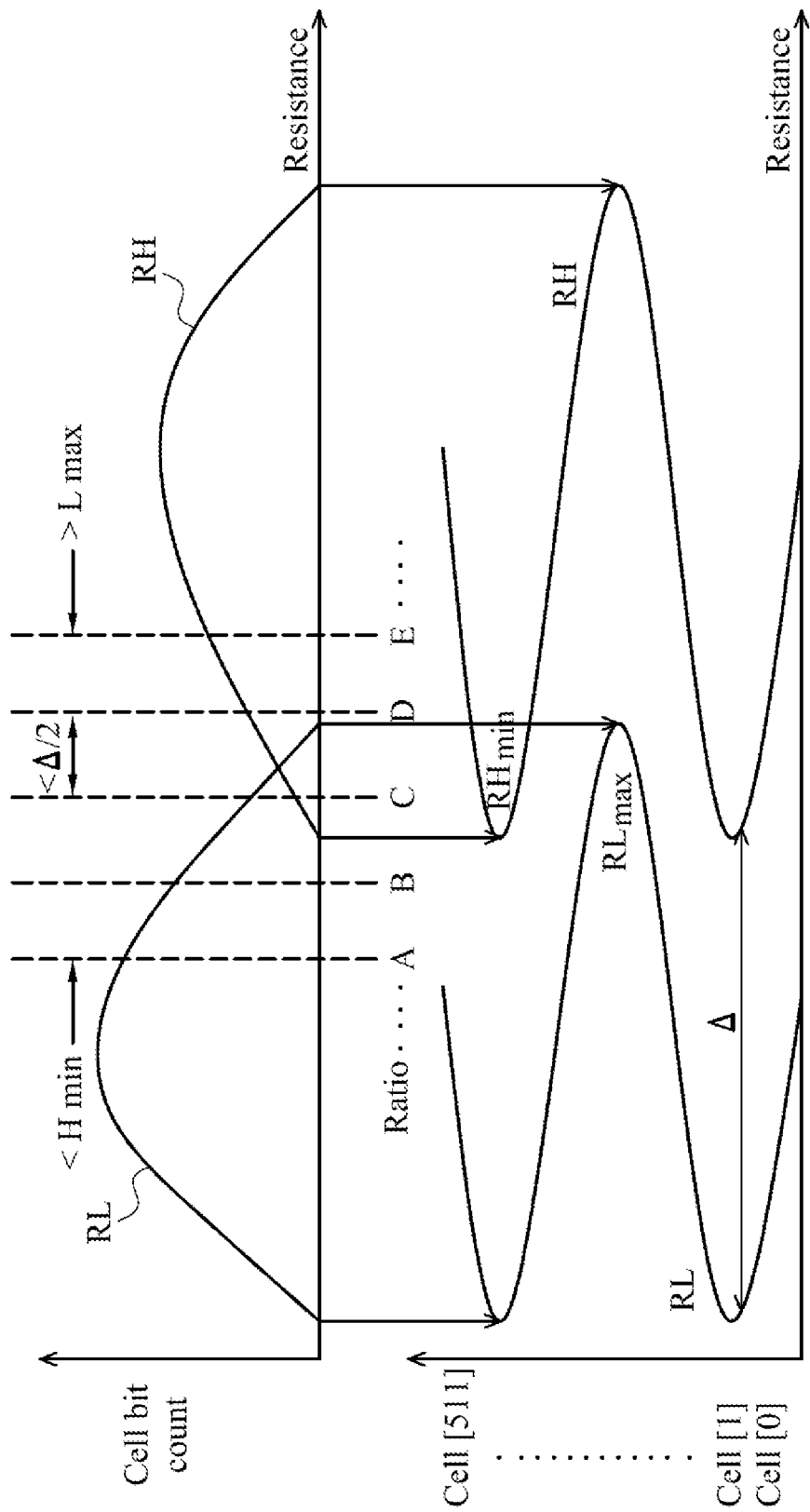
FIG. 2 is another graph illustration resistance distribution for MRAM cells in an array.

FIG. 2 is a graphical illustration showing some concepts underlying certain embodiments of a multi-level sense amplifier described herein. As with FIG. 1, FIG. 2 shows cell bit counts against resistance values. As can be seen from the upper half of FIG. 2, there is an area of overlap between the low resistance values RL and the high resistance values RH defined between RHmin, which is the lowest expected value for RH for a MRAM cell in an array of cells, and RLmax, which is the highest expected value for RL for a MRAM cell in the array of cells. The value delta ($\Delta$) illustrated in the bottom half of FIG. 2 represents the difference between RH and RL for a given cell. It turns out that this value is consistent across different cells (as illustrated in FIG. 2) at a given sense current even though individual cells from the array may have different RH and RL values. The multi-level sense amplifier described below in more detail in connection with FIGS. 3 to 8. In embodiments, the multi-level sense amplifier uses sense amplifiers having different sense ratios (i.e., reference points) (illustrated as ratios A through E in FIG. 2) defining different resistance decision points (or thresholds) where the ratios are spaced in increments of less than $\Delta/2$. The outputs of the group of sense amplifiers can be analyzed to determine whether an individual cell is programmed with a resistance of RH or RL (i.e., programmed with a logic low (0) or logic high (1), respectively). In embodiments, the multi-level sense amplifier should utilize at least four ratios, including two ratios at points higher than the value of RLmax and two ratios lower than the value of RHmin.

Figure 3:
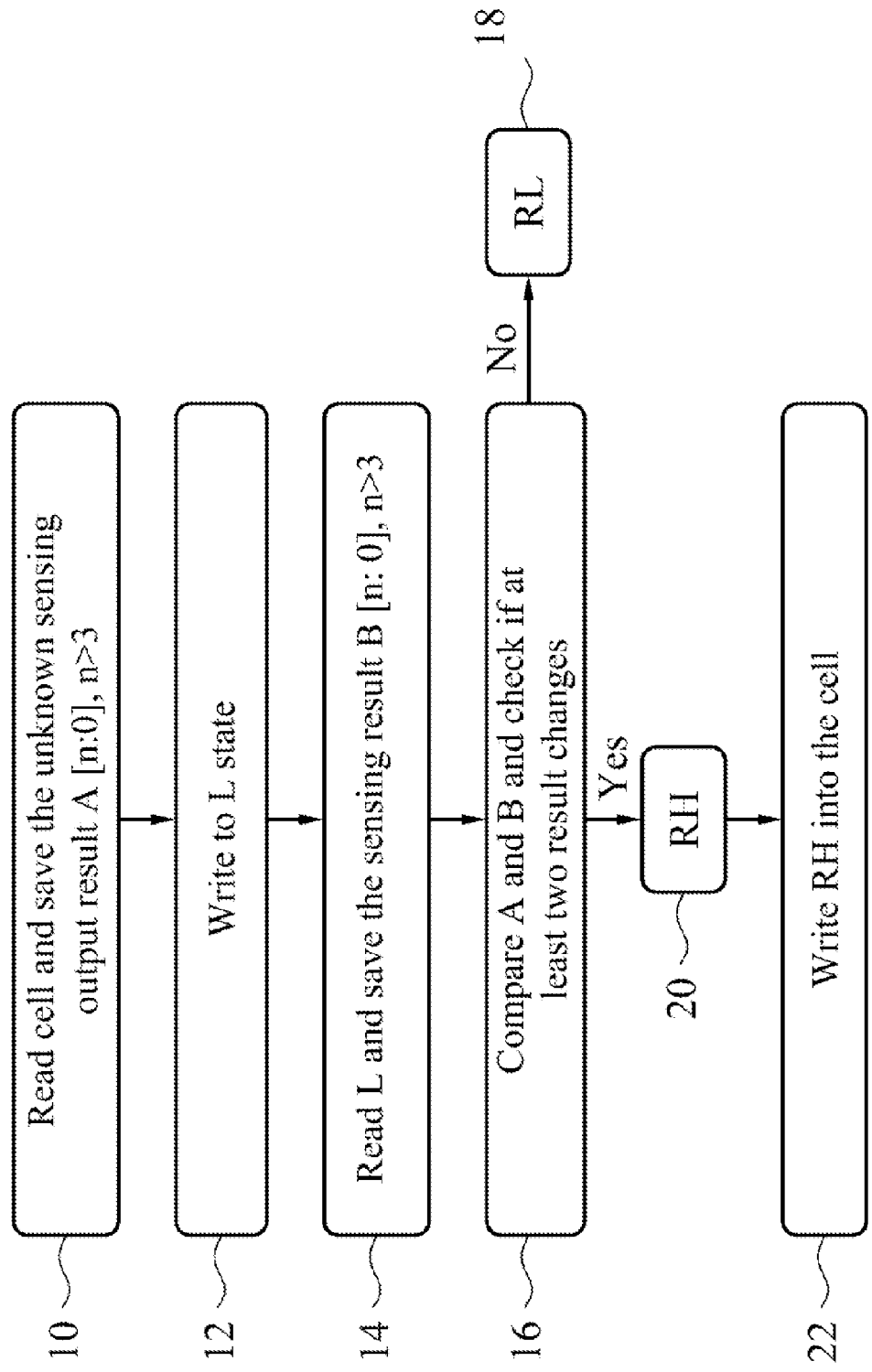
FIG. 3 is a flow diagram illustrating on exemplary method of reading a MRAM cell.

FIG. 3 is a flow diagram illustrating a method of reading a cell using a multi-level sense amplifier. This method involves a destructive read of the cell, and therefore, in certain situations, data must be rewritten into the cell. In this example, the multi-level sense amplifier has "n" number of sense amplifiers.

At step 10, the cell is read with each sense amplifier from the multi-level sense amplifier and the sense output results A[n:0], where n is greater than 3, is saved.

At step 12, the low resistance (RL) state is written into the MRAM cell.

At step 14, the cell is read again and the sensing output result B[n:0] is saved.

At step 16, the saved outputs A and B are compared to determine if the cell was originally programmed at RH or RL. If there are two or more changes between the saved outputs A[n:0] and B[n:0], then it is determined that the resistance of the read cell was RH (step 20). Otherwise, it is determined that the resistance of the read cell was RL (step 18).

At step 22, if it was determined at step 20 that the read value was RH, then RH is rewritten into the cell because the cell written low at step 12. There is no need to rewrite data to the cell if the determination at step 18 was that the cell was programmed at RL.

Figure 4:
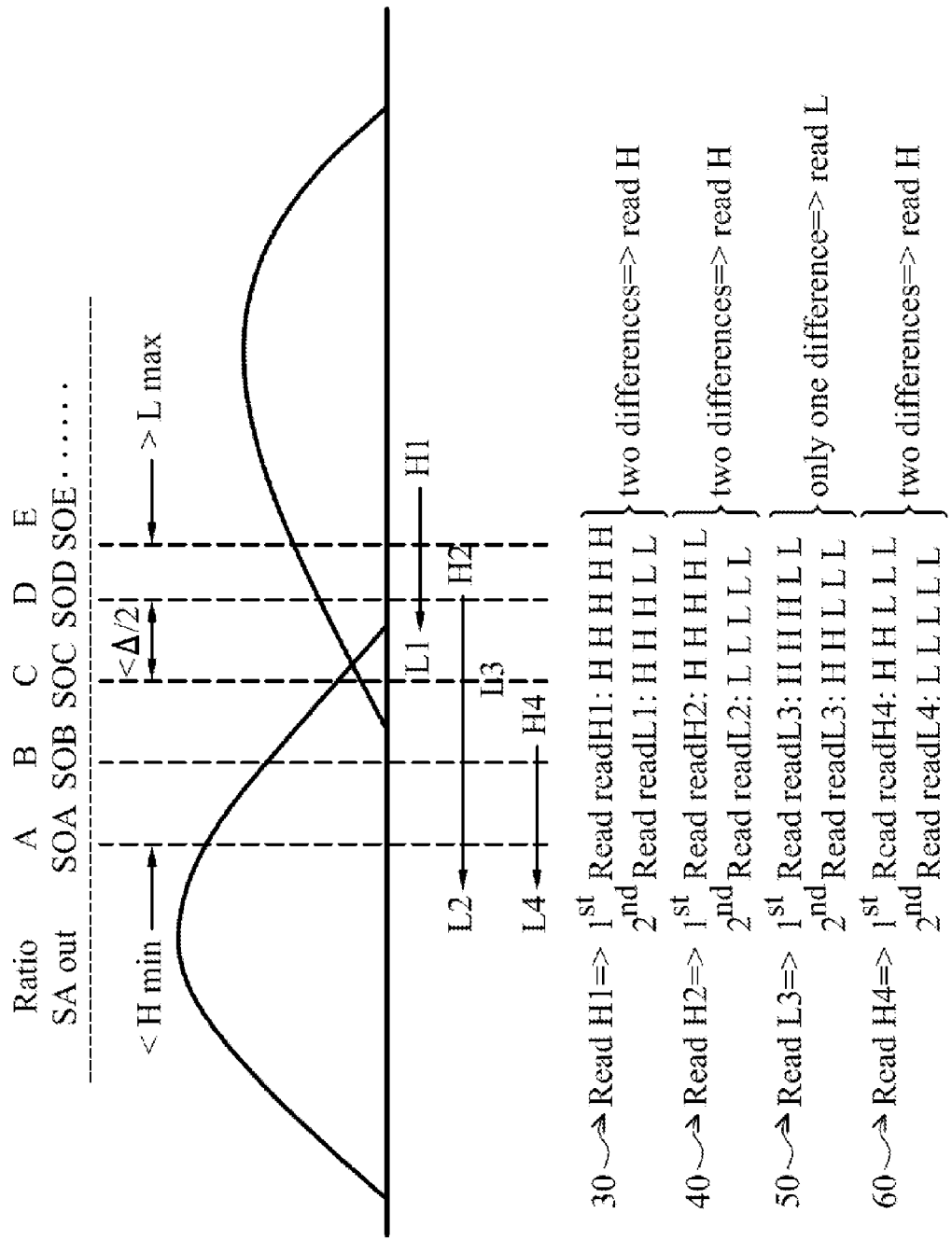
FIG. 4 illustrates the method of FIG. 3 in connection with a resistance distribution graph.

FIG. 4 shows four possible data scenarios 30 to 60 to further illustrate the reading method described above. Assume in a first scenario 30 that the coil is programmed at a resistance value of H1 that is greater than the threshold set by all of the sense ratios A to E. In the first read operation (step 10), the output of each sense amplifier is going to indicate a high value, since H1 is greater than the sense point of each sense amplifier. At step 12 a low value is written to the cell. This value is offset from the value H1 by Δ. Assume this value is L1 and falls somewhere between the threshold of ratio C and D. At step 14 the cell is read again, which results in three high outputs (from the sense amplifiers at ratios A, B and C) and two low outputs (from the sense amplifiers at ratios D and E). Because there are at least two changes in the read data (i.e., from the outputs of the sense amplifiers corresponding to ratios D and E), the decision is made at step 16 that the cell was programmed at RH. Note that the cell will need to be reprogrammed due to the low write of step 12. By having at least two sense ratios D and E that are greater than RLmax and this fall exclusively with the RH distribution, the approach guarantees that even if the cell is programmed at RHmax then the reprogramming, of that cell to its corresponding RL value crosses at least those two ratios that falls exclusively within the RH distribution. It should be noted also that the spacing of the ratios is less than Δ/2, meaning the move from RH to RL, which is a move of Δ, crosses at least two sense ratios.

Assume in the second scenario 40 that the cell is programmed at a resistance value of H2 that falls somewhere between ratios D and E. In the first read operation (step 10), the outputs of the first four sense amplifiers are going to indicate a high value, since H2 is greater than the sense point of each of those sense amplifiers, but the output of the last sense amplifier is going to indicate a low value, since H2 is less than the sense point of the last sense amplifier. At step 12 a low value is written to the cell. This value is offset from the value H2 by Δ, so the resistance value moves across at least two sense ratio points (i.e., because the spacing must be less than Δ/2). Assume this value is L2 and falls below the threshold of ratio A. At step 14 the cell is read again, which results in five low outputs. Because there are at least two changes in the read data, the decision is made at step 16 that the cell was programmed at RH. Note that the cell will need to be reprogrammed due to the low write of step 12.

Assume in the third scenario 50 that the cell is programmed at a resistance value of L3 that falls right along ratio C. Conventional sense amplifiers would not provide a definitive data output in this situation because it falls in the RH/RL overlap region and because it falls along a sense ratio. In the first read operation (step 10), the outputs of the first two sense amplifiers are going to indicate a high value, since L3 is greater than the sense point of each of those sense amplifiers. The third sense amplifier may read a value of H since the output is indeterminable, having fallen too close to the actual ratio. The fourth and fifth sense amplifiers will read low values, since L3 is less than the sense point of the last two sense amplifiers. At step 12 a low value is written to the cell. Note that there is no offset from the original value L3 since the original cell was programmed at a low resistance. The value remains at L3. At step 14 the cell is read again, which results in only one data change corresponding to the output of the third sense amplifier. That it, this time the sense amplifier read the output as low. Because there is only one change in the read data, the decision is made at step 16 that the cell was programmed at RL. Note that the cell will not need to be reprogrammed since its data state was not changed by the low write of step 12. Also note that it does not matter what value is read by the third sense amplifier in the first and second read operations. At most, there can be only one change in data and sometimes when the resistance values falls on top of the sense point there may be no change of data.

In a last example, assume in the fourth scenario 60 that the cell is programmed at a resistance value of H4 falling at or near the RHmin value and somewhere between ratios B and C. Conventional sense amplifiers would not provide a definitive data output in this situation because it falls in the RH/RL overlap region. In the first read operation (step 10), the outputs of the first two sense amplifiers are going to indicate a high value, since H4 is greater than the sense point of each of those sense amplifiers, but the outputs of the last three sense amplifiers are going to indicate a low value, since H4 is less than their respective sense thresholds. At step 12 a low value is written to the cell. This value is offset from the value H4 by Δ, so the resistance value moves across at least two sense ratio points (i.e., because the spacing must be less than Δ/2). Assume this value is L4 and falls below the threshold of ratio A. At step 14 the cell is read again, which results in five low outputs. Because there are at least two changes in the read data, the decision is made at step 16 that the cell was programmed at RH. Note that the cell will need to be reprogrammed due to the low write of step 12.

Per the foregoing, it should be apparent that the multi-level sense amplifier is configured to reflect at least two data changes when a cell programmed at RH is read, programmed at a level RL and then reread. At least two data changes occur because the increments between the sense thresholds is set to be less than Δ/2 and it is known that reprogramming the cell from RH to RL will change the resistance of the cell by the value of Δ. As such, the reprogramming operation is guaranteed to move the resistance value lower across at least two threshold points if the original programming is RH. Therefore, the multi-level sense amplifier is capable of reading even cells that fall within the grey overlap region between RHmin and RLmax.

As noted above, in embodiments the multi-level sense amplifier regarding at least two ratios higher than RLmax and at least two ratios lower than RHmin. This approach accounts for the two worst case scenarios. In a first scenario, a cell is programmed at RH and when it is reprogrammed to the low value RL this value RL falls at RLmax. Setting at least two ratios higher than RLmax guarantees that at least the outputs of those two amplifiers will change. In a second scenario, the cell is programmed at RHmin. Having at least two ratios lower than RHmin ensures that if the cell is programmed at RH, then there will be at least two data state changes after programming that cell to RL because the spacing between ratios is set at less than Δ/2.

Figure 5:
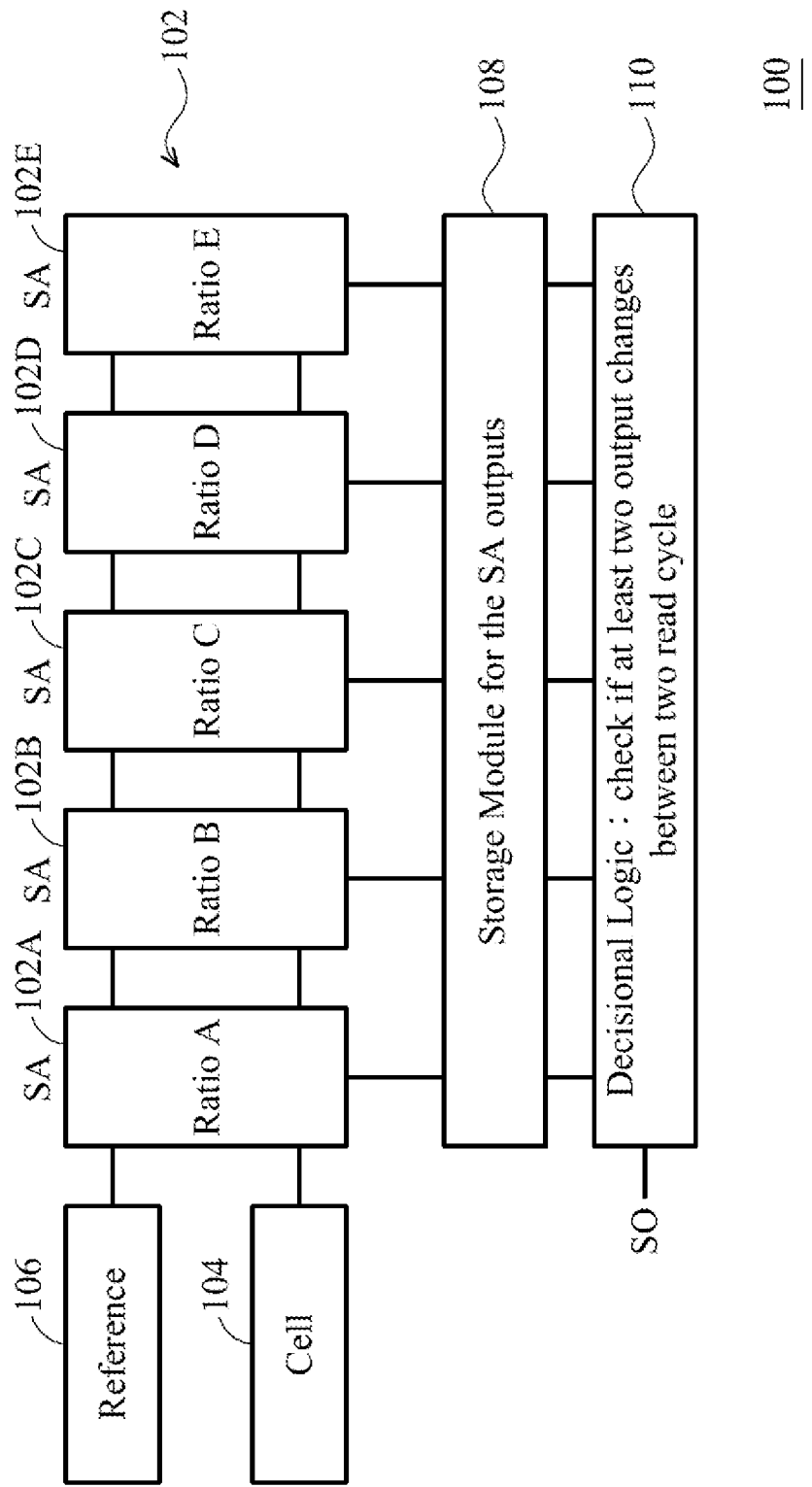
FIG. 5 illustrates an embodiment of a read architecture for a MRAM cell.

FIG. 5 illustrates an embodiment of a read architecture 100 utilizing a multi-level sense amplifier for implementing the read technique described above. The architecture includes MRAM cell 104 programmed either to Rh or RH. A reference current source 106 is provided, which could be a MRAM cell or a current source. The cell 104 and reference 106 are coupled to a bank 102 of sense amplifiers each configured at a different ratio. Specifically, sense amplifier 102A is configured at ratio A; sense amplifier 102B is configured at ratio B; sense amplifier 102C is configured at ratio C sense amplifier 102D is configured at ratio D; and sense amplifier 102E is configured at ratio E. Each sense amplifier 102 has a respective output coupled to a circuit module 108 for storing the sense output of each amplifier. The architecture also includes a decision module 110 for checking the sense amplifier outputs and determining if an RH or RL condition has been read from the cell based on the changes (if any) in the sense amplifier outputs from the first read to the second read. For example, if the module 110 determines that a high resistance has been read, then the sense output SO is set to logical 0, and if the module 110 determines that a low resistance has been read, then the sense output SO is set to logical 1. It should be understood that while the architecture 100 illustrated in FIG. 5 shows only one cell being read, the basic architecture would be adapted for reading multiple cells in an array of cells using conventional selection and multiplexing techniques used in the memory art.

It should be apparent that control logic for implementing the reading technique, providing any necessary control signals to the modules, as well as read and write control signals can be implemented in the memory controller of the MRAM array. Of course, an additional integrated circuit controller for controlling the array may also be used.

One approach to selecting the sense ratios of the sense amplifiers is described below. This approach begins by looking at the worst case cells, i.e., those cells with RH at RHmin and RL at RLmax.

Tunneling Magneto Resistance (TMR) ratio is one of the major performance criteria of STT-MRAM cells. The TMR ratio for a cell is defined as (RH−RL)/RL. Assume that the minimum TMR ratio is 66% (0.66) and that the bit line voltage VBL is 0.2V. With a ratio of 0.66, it is known that RH=1.66*RL. It is also known that VBL=Icell*Rcell. Assume that RLmax is 4800 ohms. A cell at this RLmax will have an RH of 1.66*4800=7968 ohms. The current of the cell when at RLmax is equal to 0.2V/4800 ohms=41.6 $\mu$A, and the cell current when at RH is equal to 0.2V/7968 ohms=25 $\mu$A. In this situation, there is a delta current of 41.6 $\mu$mA−25 $\mu$mA=16.6 $\mu$A. Half of this delta current is 8.3 $\mu$A.

Assume that the RHmin is 3800 ohms. A cell at this RHmin will have an RL value that is 3800/1.66, i.e., 2289 ohms. The current of the cell when at RHmin is 0.2V/3800 ohms, i.e., 52.6 $\mu$A, and the cell current of the cell when at RL is 0.2V/2289 ohms, i.e., 87.37 $\mu$A. Therefore, for this cell, there is a delta current of 87.37 $\mu$A−52.6 $\mu$A=34.77 $\mu$A. Half of this delta current is 17.4 $\mu$A. In summary, for any cells at RLmax, there is a half delta current equal to 8.3 $\mu$A from RL to RH, and for any cells at RHmin, there is a half delta current of 17.4 $\mu$A from RH to RL. Actually, however, the RLmax to RH scenario is not a concern because the read approach only needs to ensure that a cell initially programmed to RH and then rewritten to RL (i.e., step 12 of FIG. 3) crosses two ratios. That is, it can be assumed that a cell initially written to RL and then rewritten to RL will not cross any ratios (or at most 1 if its resistance value straddles a sense ratio point). So, the half delta of 17.4 $\mu$A is selected. From this selection the ratios can be designed or selected.

First, a reference resistance between RLmax (4800 ohms) and RHmin (3800 ohms) is selected. In this example, a reference resistance of 4188 ohms is selected.

Second, ratios are selected that keeps the increments between adjacent sense points at less than half delta (i.e., less than 17.4 $\mu$A). For example, the following ratios can be selected: X1.3, X1.2, X1, X0.8 and X0.7. A simple calculation can confirm that these ratios meet the half delta requirement. As noted above, the reference (X1) was set at 4188 ohms. The cell current at this resistance is 0.2V/4188 ohms=47.755 $\mu$A. The sense amplifier with sense ratio X1.2 corresponds to a resistance sense threshold of 3508 ohms, i.e., 47.755 $\mu$A*1.2=57 $\mu$A; 0.2V/57 $\mu$A=3508 ohms. The sense amplifier with sense ratio X1.3 corresponds to a resistance sense threshold of 3220 ohms, i.e., 47.755 $\mu$A*1.3=62.1 $\mu$A; 0.2V/62.1 $\mu$A=3220 ohms. The sense amplifier with sense ratio X0.8 corresponds to a resistance sense threshold of 5235 ohms, i.e., 47.755 $\mu$A*0.8=38.204 $\mu$A; 0.2V/38.204 $\mu$A=5235 ohms. Last, the sense amplifier with sense ratio X0.7 corresponds to a resistance sense threshold of 5983 ohms, i.e., 47.755 $\mu$A*0.7=33.4285 $\mu$A; 0.2V/33.4285 $\mu$A=5983 ohms. Each ratio is spaced from an adjacent ratio by less than half delta (i.e., less than 17.4 $\mu$A): 62.1 $\mu$A; 57 $\mu$A; 47.775 $\mu$A; 38.4285 $\mu$A; and 33.4285 $\mu$A. Also, there are the requisite two ratios less than RHmin (3800 ohms) (i.e., X1.2 and X1.3, which are at 3508 ohms and 3220 ohms, respectively), and there are the requisite two ratios greater than RLmax (4800 ohms) (i.e., X0.7 and X0.8, which are at 5983 and 5235, respectively).

Figure 6:
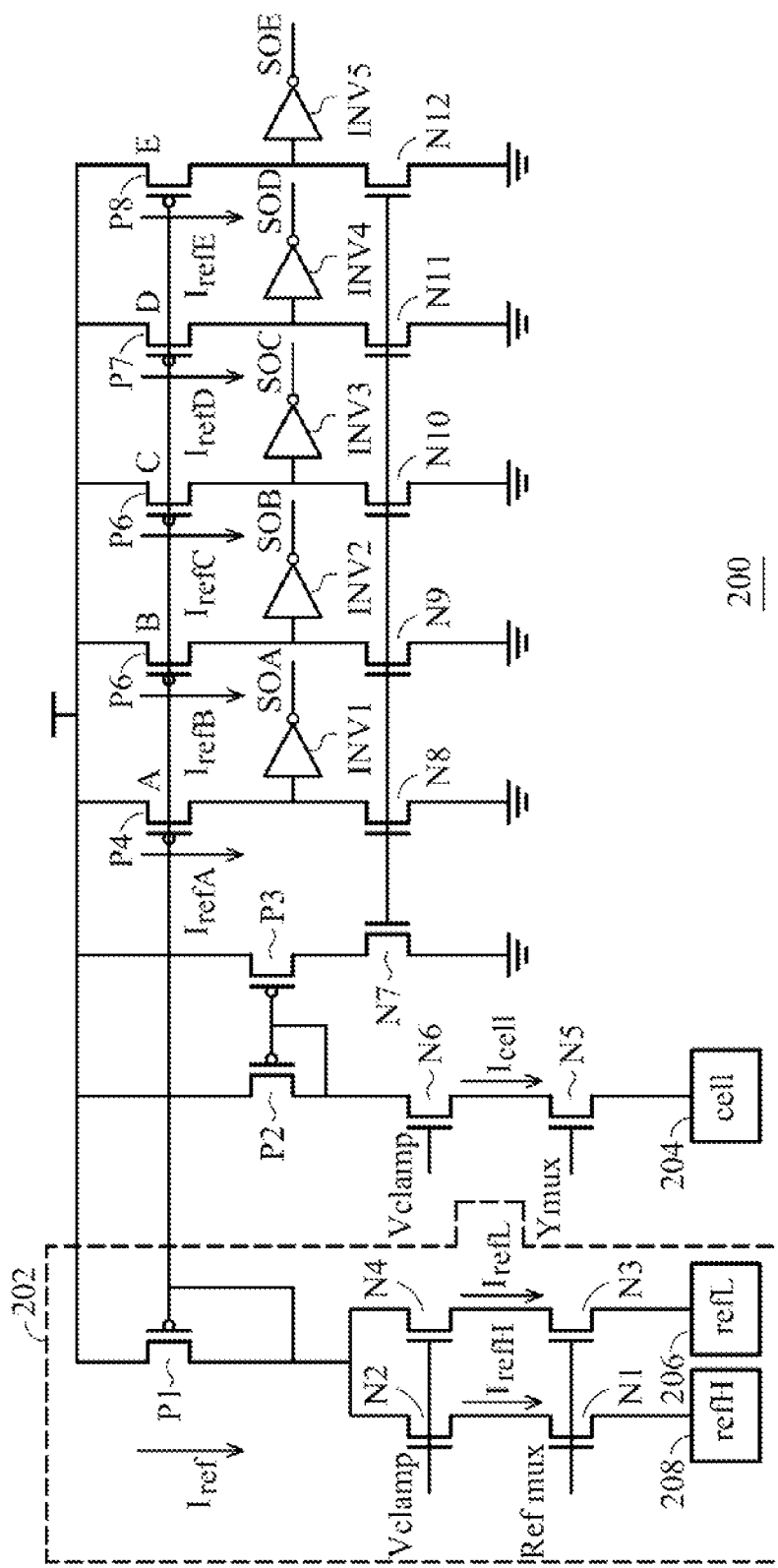
FIG. 6 illustrates an embodiment of a multi-level sense amplifier for use in the read architecture of FIG. 5.

FIG. 6 illustrates a circuit diagram of a first embodiment of a multi-level sense amplifier 200 that may be used in the architecture of FIG. 5. The multi-level sense amplifier 200 includes a reference section 202 including a reference cell 206 programmed at a RL value and a reference cell 208 programmed at a RH value. The reference section 202 includes NMOSs N2 and N4 tied to clamping voltage Vclamp and selection transistors N1 and N3 tied to control signal Ref mux. The clamping voltage Vclamp is used to clamp the bitline voltage. For example, Vclamp may be set to 0.7V. If the threshold voltage is 0.5V, then the bit line voltage is 0.2V.

The reference section 202 generates reference current Iref equal to IrefH+IrefL. The multi-level sense amplifier also includes five sense amplifiers for providing five sense outputs SOA, SOB, SOC, SOD, and SOE. Transistor pairs P1/P4, P1/P5, P1/P6, P1/P7 and P1/P8 provide current mirrors for mirroring the reference current Iref to the five sense amplifiers. Transistors P4, P5, P6, P7 and P8 are sized to provide the sensing ratios discussed above. For example, using the example sense ratios above of 1.3, 1.2, 1, 0.8 and 0.7, the PMOS are sized as follows: PMOS P4 is sized to provide a current IrefA equal to the average or midpoint between IrefH and IrefL (i.e., Iref/2) times 1.3; PMOS P5 is sized to provide a current IrefB equal to 1.2×(Iref/2); PMOS P6 is sized to provide a current IrefC equal to Iref/2; PMOS P7 is sized to provide a current IrefD equal to 0.8×(Iref/2); and PMOS P8 is sized to provide a current IrefE equal to 0.7×(Iref/2).

The cell current Icell is generated from the cell 204 in response to the bit line clamping voltage and at a level dependent on whether the cell is programmed to RH or RL. The cell current Icell is mirrored via current mirror pair PMOS P2/P3 and through NMOS mirror pairs N7/N8, N7/N9, N7/N10 and N7/N11. PMOS P4 and NMOS N8 are coupled together to inverter INV1, which provides output SOA. PMOS P6 and NMOS N9 are coupled together to inverter INV2, which provides output SOB. PMOS P6 and NMOS N10 are coupled together to inverter INV3, which provides output SOC. PMOS P7 and NMOS N11 are coupled together to inverter INV4, which provides output SOD. Finally, PMOS P8 and NMOS N12 are coupled together to inverter INV5, which provides output SOE.

This structure mirrors the reference current and the cell current to each branch of the multi-level sense amplifier. In a given branch, if the reference current is greater than the cell current, then the voltage between PMOS and NMOS transistors of the branch will be higher. If reference current is less than the cell current, then voltage between the PMOS and NMOS transistors of that branch will be lower. An inverter, such as is shown in FIG. 5, or other structure (e.g., a simple voltage amplifier) can be used to map the higher voltage to a logic value of "1" and the lower voltage to a logic value of "0".

Figure 6A:
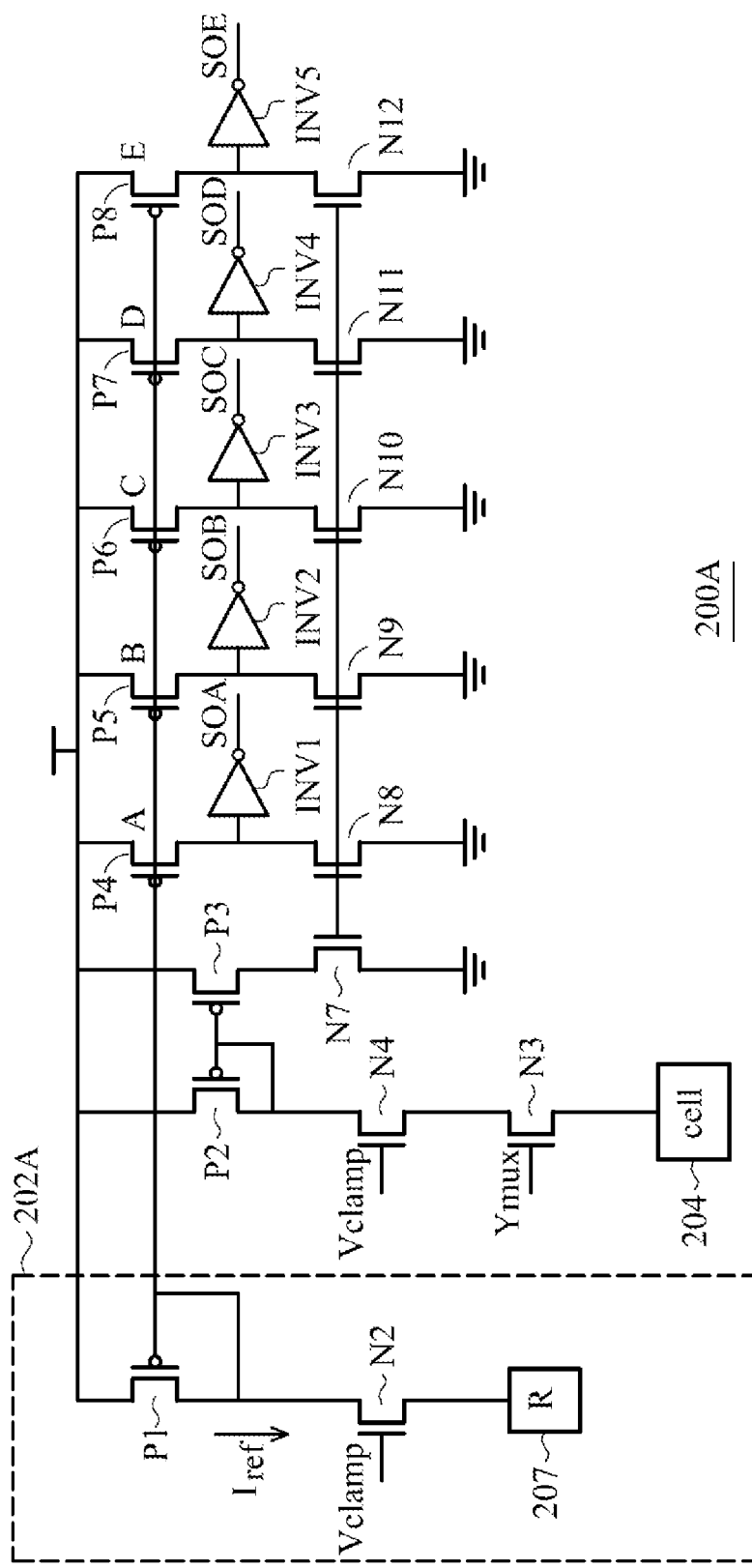
FIG. 6A illustrate an alternative embodiment of the multi-level sense amplifier for use in the read architecture of FIG. 5.

FIG. 6A illustrates an alternative embodiment of a multi-level sense amplifier 200A. The sense amplifier 200A of FIG.

6 is identical to that of the sense amplifier 200 of FIG. 6 only it uses a modified reference section 202A. The reference section 202A generates a reference current Iref from a constant resistance 207 (e.g., polysilicon resistors, MOSFET biased in triode region, etc.).

Figure 7:
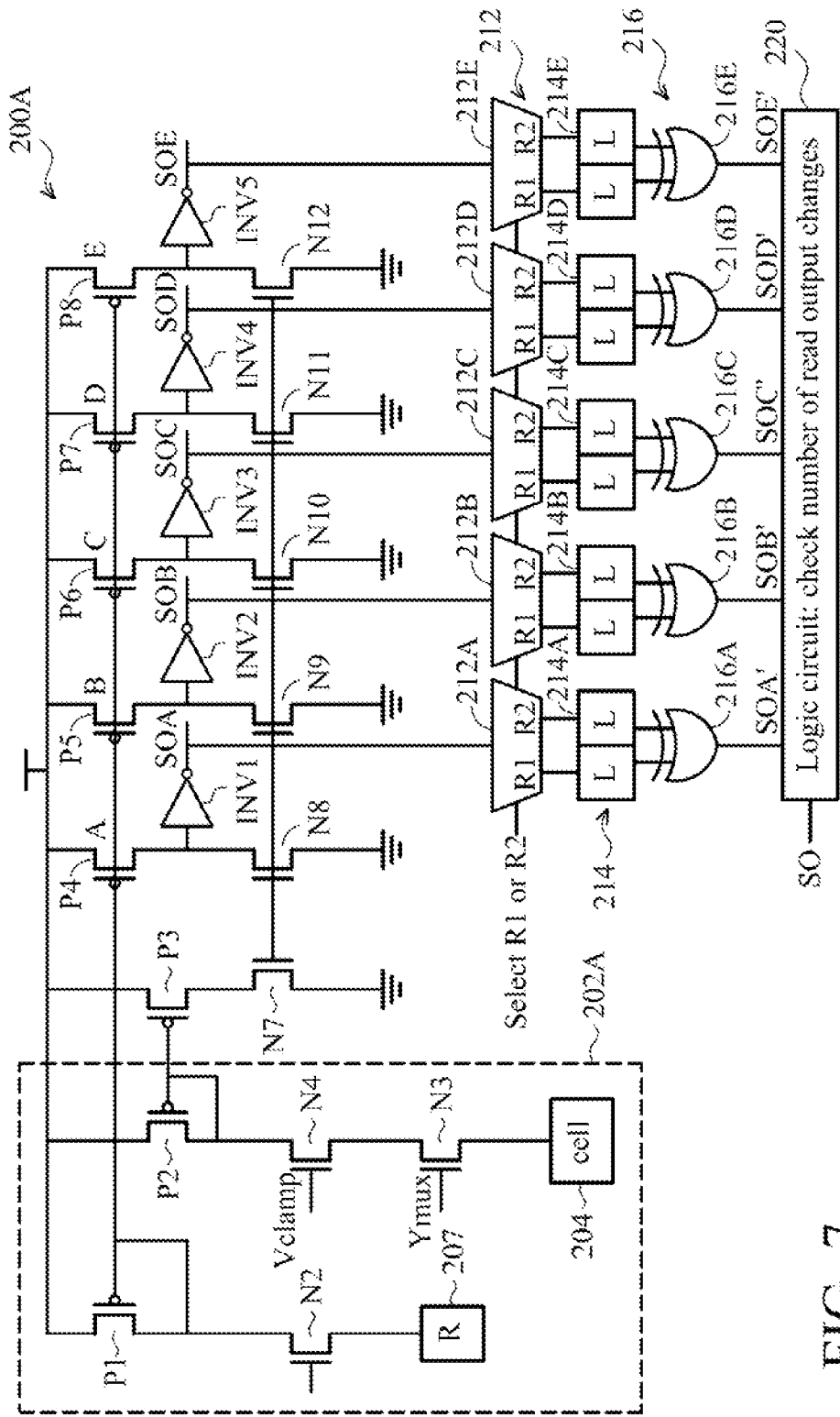
FIG. 7 illustrates an embodiment of the read architecture of FIG. 5.

FIG. 7 illustrates an embodiment of the storage and decisional logic 210 coupled to the sense outputs SOA to SOE of the multi-level sense amplifier 200A of FIG. 6A. The outputs SOA to SOE are coupled to a multiplexer bank 212 that includes multiplexers 212A, 212B, 212C, 212D and 212D coupled to the sense outputs SOA to SOE, respectively. The multiplexer includes two outputs coupled to a pair of data storage nodes of data storage module 214. In the illustrated embodiment, each data storage module is formed from a pair of data latches L for holding data outputted from its corresponding connected multiplexer. Latch pair 214A is coupled to the output of multiplexer 212A; latch pair 214B is coupled to the output of multiplexer 212B; latch pair 214C is coupled to the output of multiplexer 212C; latch pair 214D is coupled to the output of multiplexer 212D; and latch pair 214E is coupled to the output of multiplexer 212E. A control signal is provided from the memory controller to the multiplexers to control whether the individual multiplexers pass the sensed output to either the first or second latch of the respective latch pair. That is, one of the latches of the latch pair receives the result of the first read operation (step 10 of FIG. 3) and the other latch receives the result of the second read operation (step 14 of FIG. 3). A bank 216 of exclusive OR (XOR) gates is coupled to the data storage module 214. Specifically, latch pair 214A is coupled to the inputs of the XOR gate 216A; latch pair 214B is coupled to the inputs of the XOR gate 216B; latch pair 214C is coupled to the inputs of the XOR gate 216C; latch pair 214D is coupled to the inputs of the XOR gate 216D; and latch pair 214E is coupled to the inputs of the XOR gate 216E. The XOR gate's logic function can be summarized as one or the other, but not both. So, if there is any difference between the data stored in the latches of a latch pair, the XOR gate will output a logic high (1). Otherwise, the XOR will output a logic low (0). The outputs of the XOR gates 216A to 216E are coupled to decision logic module 220, which determines the number of read output changes (e.g., do the number of changes meet the minimum number of changes (i.e., 2) to determine the cell is programmed at RH) and outputs a sense output SO in accordance therewith.

Figure 8:
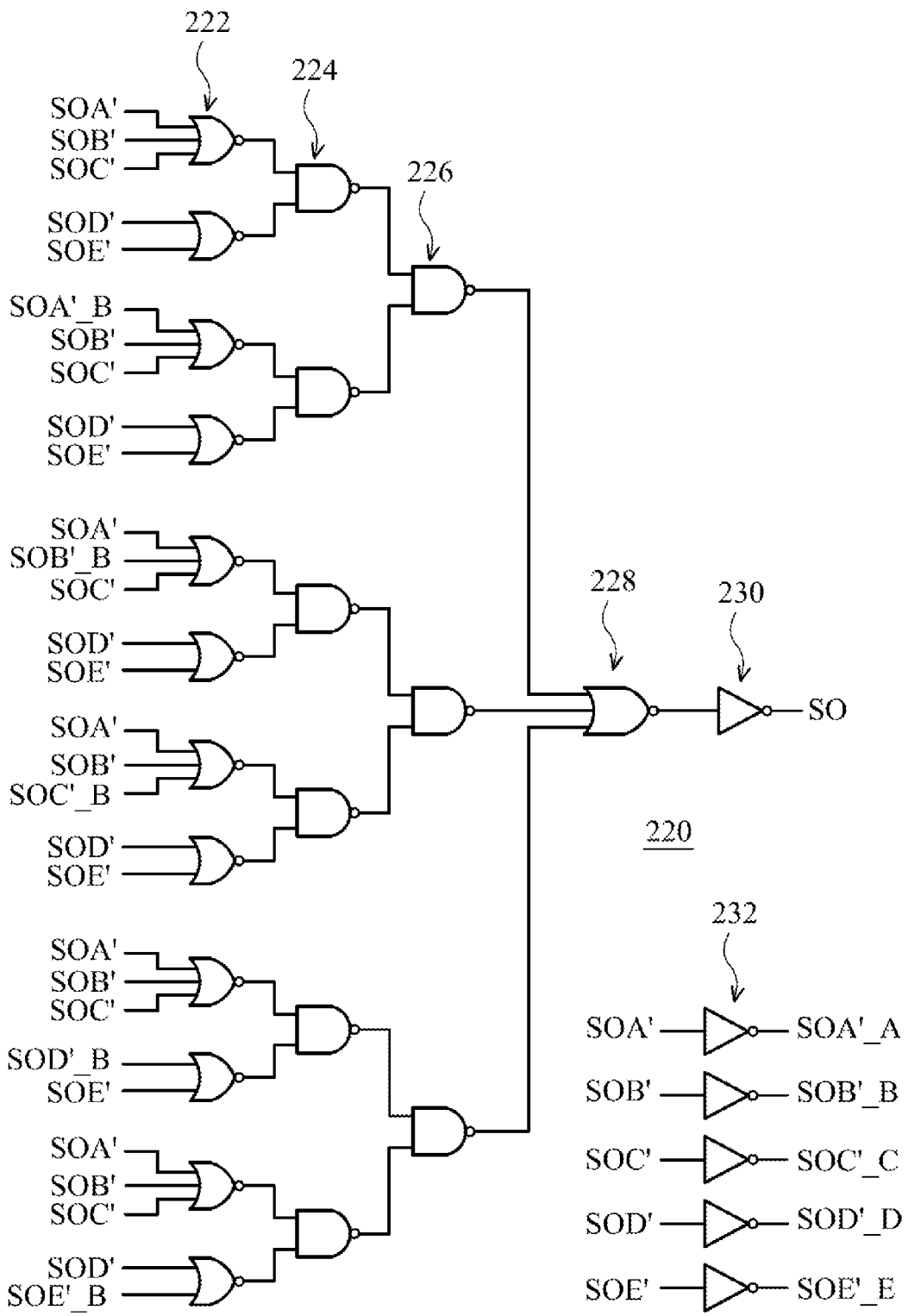
FIG. 8 illustrates an embodiment of a decision logic for use in the read architecture of FIG. 7.

FIG. 8 illustrates an embodiment of the logic module 220 illustrated in FIG. 7. It should be understood that there are numerous logic combinations that can be used to determine the number of read output changes and outputs sense output SO in accordance therewith and that FIG. 8 illustrates only one such embodiment. Also, analog approaches and combinations of analog and digital can also be utilized, e.g., a storage capacitor where the voltage level represents the number of data changes and an output inverter, etc.

In the illustrated embodiment, a bank of inverters is used to invert outputs SOA' to SOE' from the XOR gates 216 to provided inverted outputs SOA'_B to SOA'_E, respectively. A series of gates is also provided to implement the following logic: if none, or only one, of SOA' to SOE' are logical 1 (meaning there was one or less data changes between the first and second reads of the MRAM cell), then the output SO is logical "1" (i.e., the MRAM cell was programmed at a low resistance value); else, output logical "0" (i.e., MRAM cell was programmed at a high resistance value). This logic is implemented in the illustrated embodiment via a first bank of NOR gates 222, a first bank of NAND gates 224 coupled to the outputs of the NOR gates, a second bank of NAND gates 226 coupled to the output of the first bank of NAND gates 224, a NOR gate 228 coupled to the outputs of the NAND gates 226 and an inverter coupled to the output of the NOR gate 228.

FIGS. 9-12D described below illustrate an alternative embodiment of a MRAM cell read architecture and methods and the underlying concepts thereof. This alternative embodiment is non-destructive in nature, meaning data does not have to be rewritten to the read cell after the read. This approach has advantages in read latency and power consumption.

Figure 9:
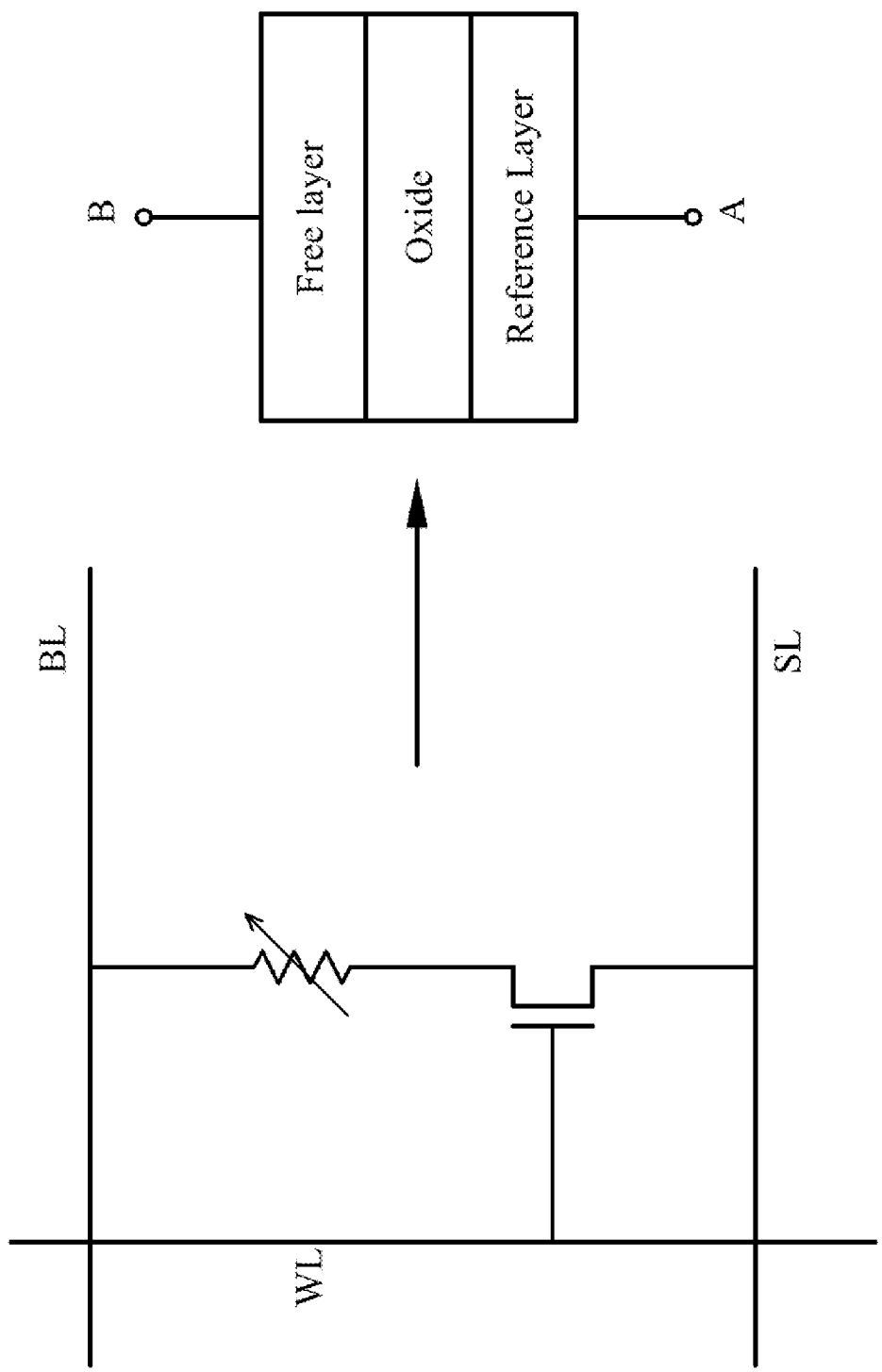
FIG. 9 is illustrates a MRAM cell in circuit illustration.

FIG. 9 shows a one-transistor MTJ STT-MRAM cell structure. One MTJ is connected to one NMOS transistors in series between the bit line (BL) and source line (SL). The word line (WL) is connected to the gate of the NMOS selection transistor. As shown in FIG. 9, the MTJ can be modeled as a variable resistor. As described above and shown in FIG. 9, the MTJ includes two ferromagnetic layers and one oxide barrier layer, e.g., MgO. If the magnetization directions of the two ferromagnetic layers are parallel, the MTJ is in the low resistance state (RL), and if the magnetization directions are antiparallel, the MTJ is in the high-resistance state (RH).

Figure 10:
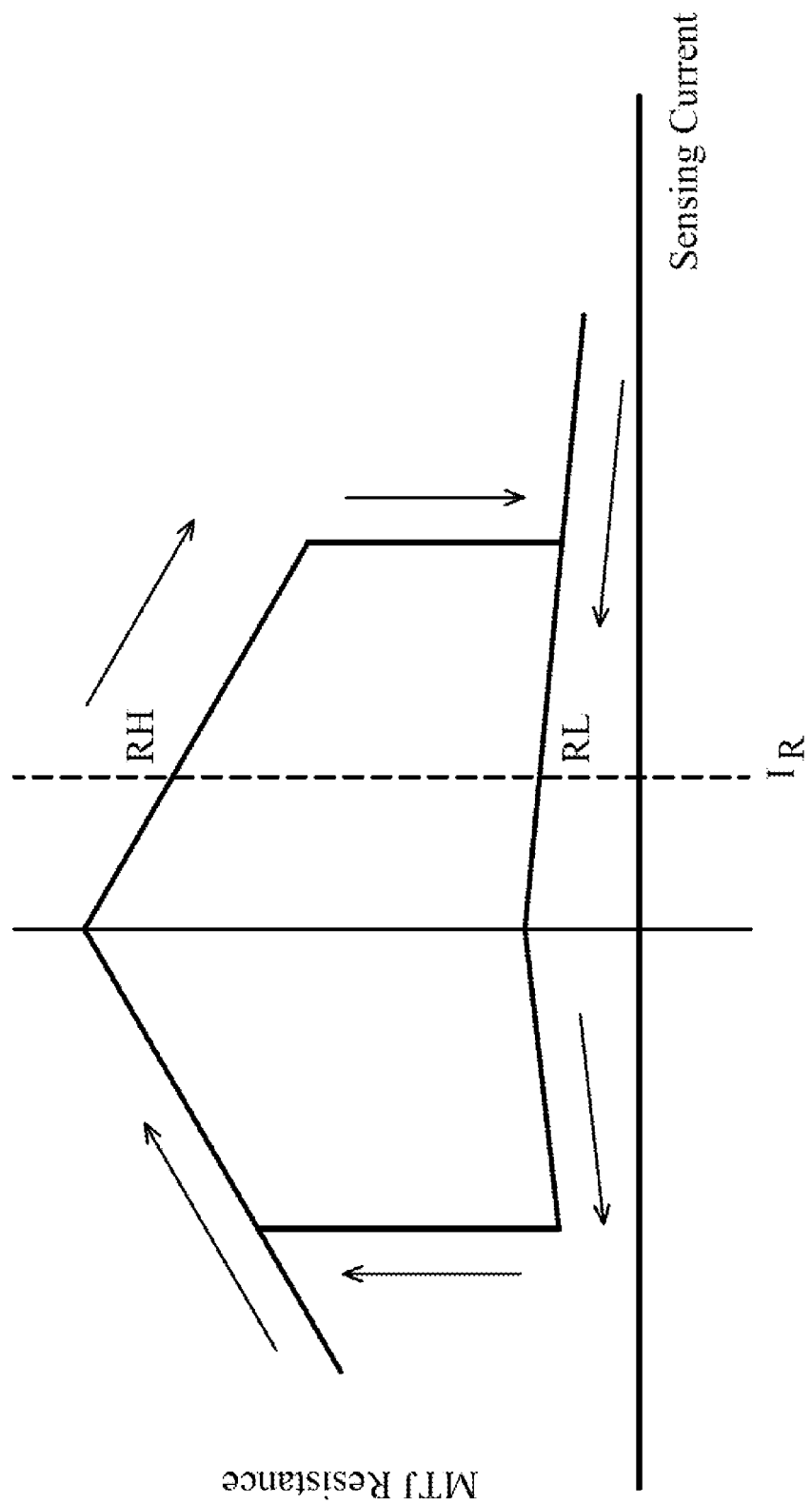
FIG. 10 is a so-called house curve illustrating MRAM magnetic tunneling junction (MTJ) resistance changes with changes in sensing current.

FIG. 10 illustrates a R-I sweep curve of an magnetic tunneling junction (MTJ) of a MRAM cell. When a positive voltage is applied on point B in FIG. 9, the MTJ enters the positive voltage region in FIG. 10 and switches from high resistance state (RH) to low resistance state (RL). When a positive voltage is applied on point A, the MTJ enters the negative voltage region and switches from the low resistance state (RL) to the high resistance state (RH).

In a conventional read scheme, a read current $I_R$ is applied to generate the bit line voltage $V_{BL}$. If the MTJ is in the low resistance state, $V_{BL}=I_R (R_L+R_{NMOS})$, where $R_{NMOS}$ is the resistance of the NMOS selection transistor. If the MTJ is in the high resistance state, $V_{BL}=I_R (R_H+R_{NMOS})$. The bit line voltage $V_{BL}$ is compared to a reference voltage $V_{REF}$ between $V_{BL,L}$ (i.e., $V_{BL}$ at $R_L$) and $V_{BL,H}$ (i.e., $V_{BL}$ at $R_H$) to read the MTJ resistance state. When the VREF is used across multiple STT-MRAM cells, VREF must be set between the maximum expected $V_{BL,L}$ and the minimum expected $V_{BL,H}$, which is not always possible as discussed above because there can be overlap in the resistance values between RH and RL across the array due to large bit-to-bit variations in MTJ resistance (See FIG. 1).

Figure 11:
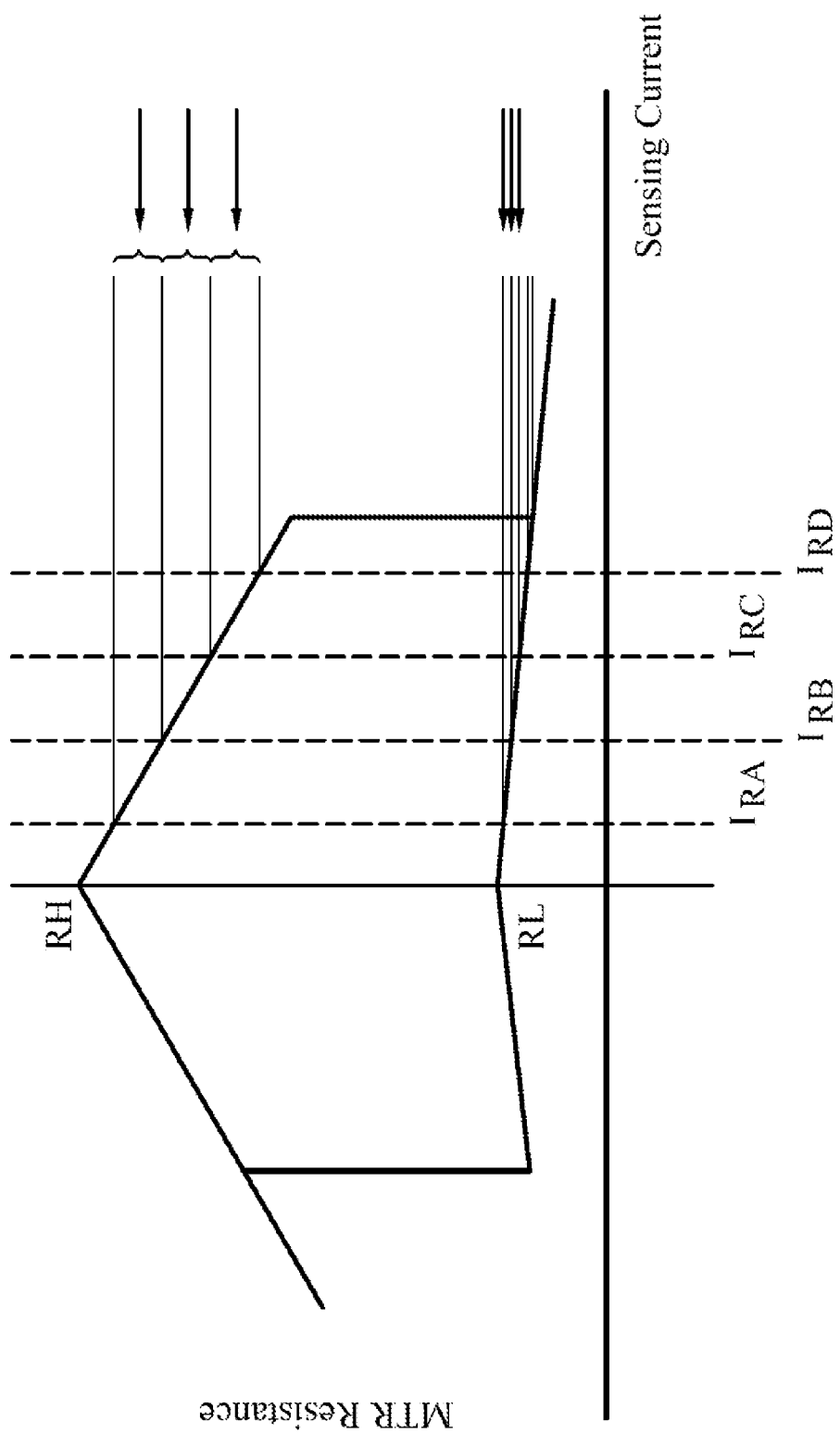
FIG. 11 illustrates another house curve.

It can be seen from FIG. 10 that the current dependence of the high and low resistance state of the MTJ are different. That is, the slope of the RH dependence for a given cell is steeper than that cell's RL dependence. With reference to FIG. 11, a read architecture is proposed that uses a multi-level sense amplifier (e.g., one using multiple read currents $I_{RA}$ to $I_{RD}$) to make a decision on whether the MRAM cell was programmed at RH (large slope) or RL (smaller slope). The read approach involves taking an initial read of the cell and establishing a sense reference for use in further reads based on this initial read. The reference is offset from the initial read. The offset is designed—recognizing the sharp difference in slopes between RH and RL illustrated in the house curves of FIGS. 10 and 11—such that the outputs of the additional reads will show whether the MRAM cell was programmed at RH or RL. That is, if the resistance value of the cell falls sharply, it is determined that the MRAM cell was programmed at RH. If the resistance value falls less sharply than would be expected for a cell programmed at RH, then it is determined that the MRAM cell was programmed at RL. This architecture and method of reading is illustrated in more detail in connection with FIGS. 12 to 12D and described below.

Figure 12:
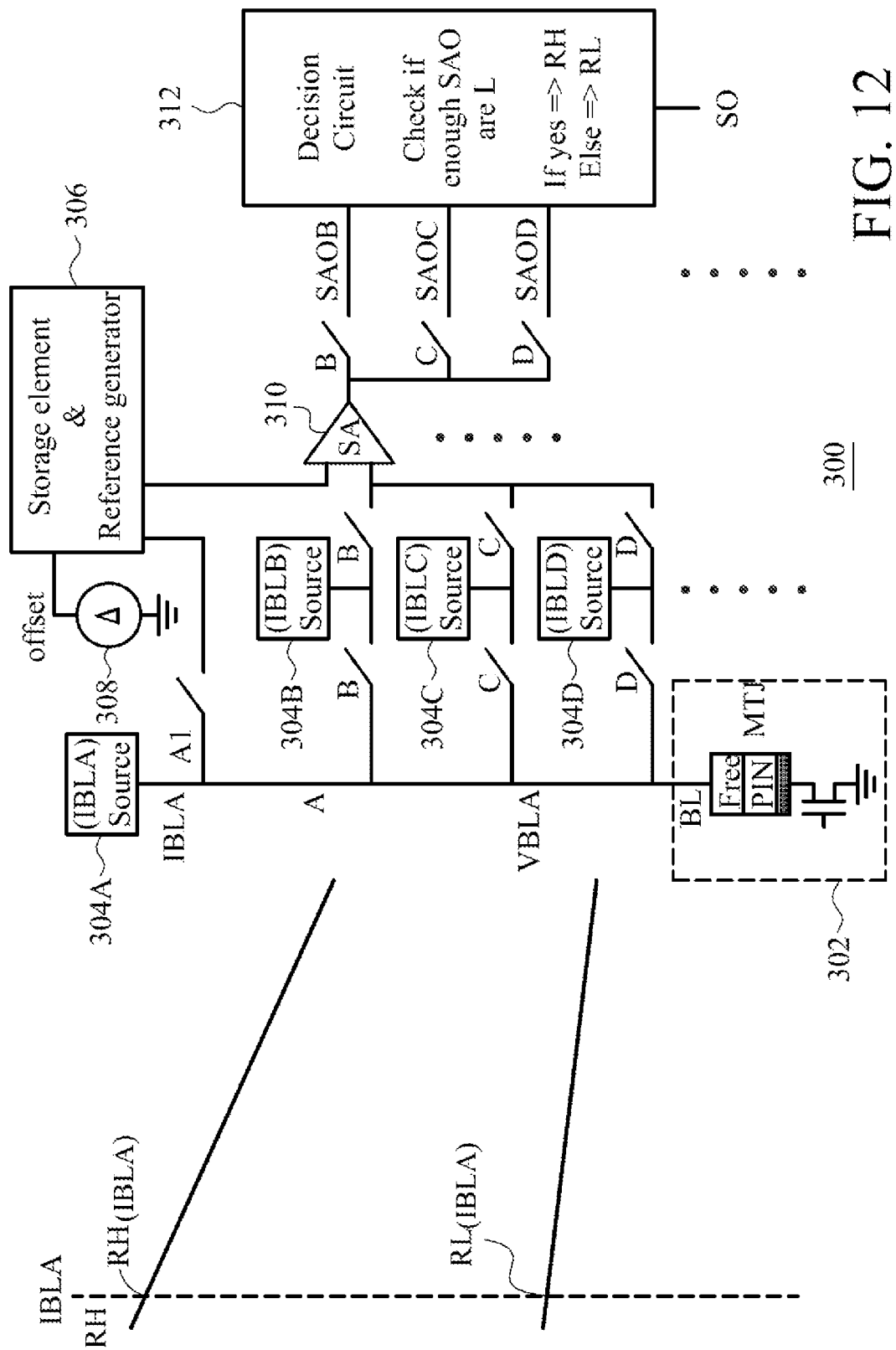
FIGS. 12-12D illustrate an embodiment of a non-destructive read architecture for reading a MRAM cell.

FIG. 12 illustrates an embodiment of a non-destructive read architecture 300. Illustrated to the left of the architecture are MTJ RH and RL curves across a range of sensing currents.

Specifically, two points are illustrated denoting the RH and RL resistance values at a first sense current IBLA. The read architecture includes a MRAM cell 302, illustrated as the combination of a selection transistor and a MTJ. The MRAM cell 302 may be, for example, STT-MRAM cell or toggle mode MRAM, cell, both of which exhibit the resistance slope characteristics illustrated in FIGS. 9, 11 and 12. The read architecture includes, by way of example only, four current sources 304A, 304B, 304C and 304D for providing current IBLA, IBLB, IBLC and IBLD, where IBLA<IBLB<IBLC<IBLD. In one embodiment, the source blocks 304 can be provided as a series of current mirrors. The architecture also includes switches A, A1, B, C and D. Storage Element & Reference Generator 306 (hereinafter, reference generator 306) is connected to a voltage offset source 308. Sense amplifier 310, which in the illustrated embodiment is a voltage senses amplifier, has a first input coupled to an out of the reference generator 306. The reference generator 306 provides a voltage reference (described below as VBLA-offset) to the first input of the sense amplifier 310. The second input of the sense amplifier 310 is selectively coupled to the cell 302 via switches B, C and D. The output of the sense amplifier 310 provides outputs SAOB, SAOC, and SAOD through switches B, C and D, respectively, to a decision circuit 312, which is also described in more detail below.

In embodiments, the sense amplifiers 310 could be a current sense amplifier. Modifications to the architecture would include, for example, providing sources 304 as current sources and providing the reference from reference generator 306 as a reference current.

The first operation performed by the read architecture is to generate the reference voltage. First, switch A is on (closed) while the other switches in architecture 300 are off (open). Current source 304A provides sensing current IBLA through switch A to the MRAM cell 302, which produces a bit line voltage VBLA. The bit line voltage VBLA is either equal to IBLA×$RH_{(IBLA)}$ or to IBLA×$RL_{(IBLA)}$ depending upon whether the MRAM cell is programmed at RH or RL, where $RH_{(IBLA)}$ is the resistance value of the particular cell being read when programmed at RH and provided a sensing current IBLA and $RL_{(IBLA)}$ is the resistance value of that cell when programmed at RL and provided a sensing current IBLA.

Figure 12A:
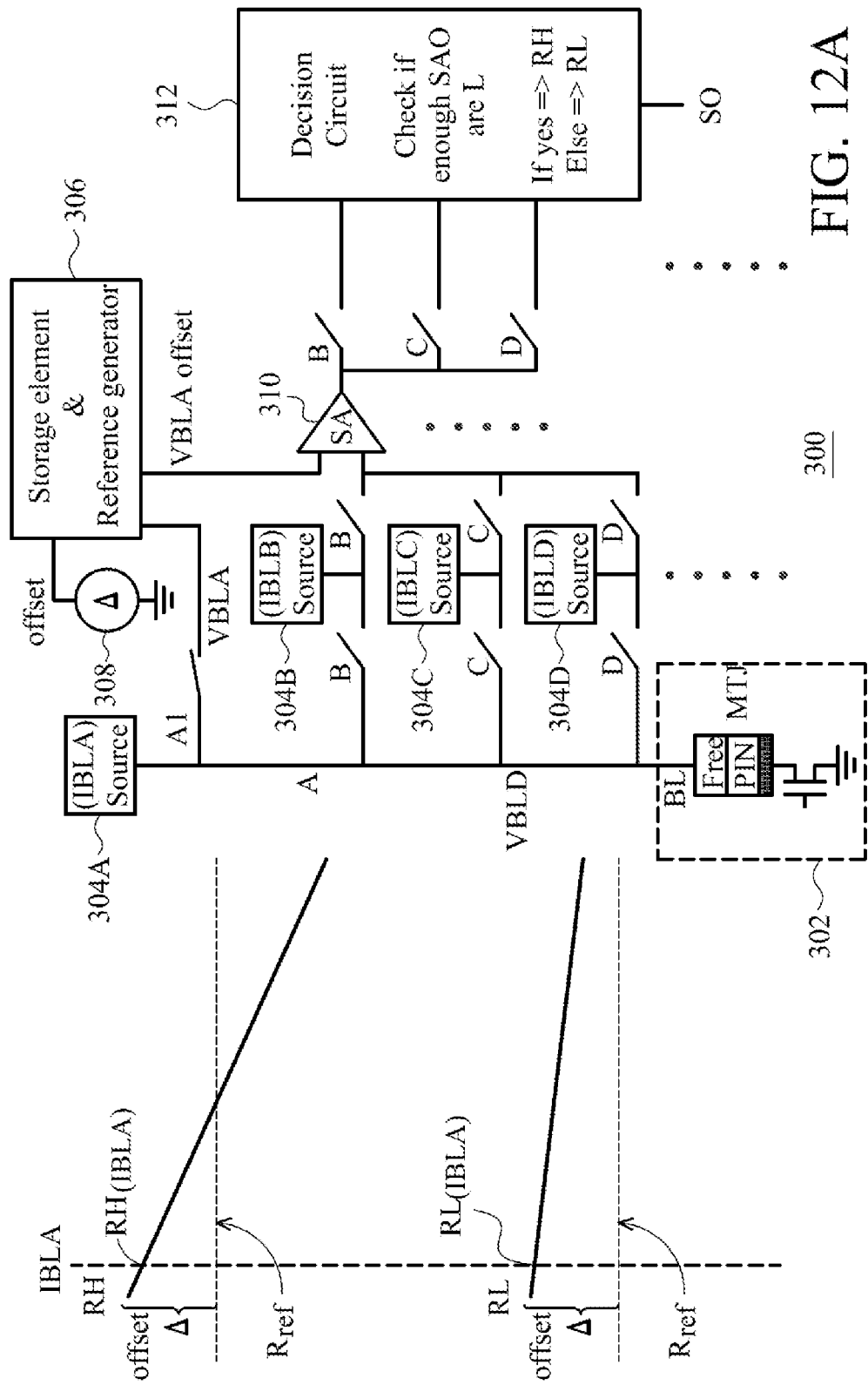

Turning to FIG. 12A, switch A remains on and A1 is turned on. The other switches remain off. Reference generator 306 stores a voltage value equal to VBLA minus some offset voltage as determined by the voltage offset element 308. This value is referred to herein as VBLA-offset. Reference generator 306 outputs this voltage to sense amplifier 312 for use as a sensing threshold.

The VBLA-offset voltage can be thought of as setting a reference resistance Rref (labeled in FIG. 12A) that is offset from the initial resistance value of the MRAM cell under low sense current IBLA. That is, depending on whether the MRAM cell is programmed at RH or RL, the value of Rref is either $RH_{(IBLA)}$–Δ, or $RL_{(IBLA)}$–Δ. In embodiments, the value of delta (Δ) is selected so that $RH_{(IBLA)}$>Rref>$RH_{(IBLD)}$. Preferably, the value of delta (Δ) is also selected so that $RL_{(IBLA)}$>$RL_{(IBLD)}$>Rref. Or, at the very least, as will be seen below, delta must be selected so that when all of the sense outputs are considered, there is a clear distinction between the outputs to be expected from a MRAM cell programmed at RH and one programmed at RL. Silicon test data can be used to select or fine tune the delta value.

Figure 12B:
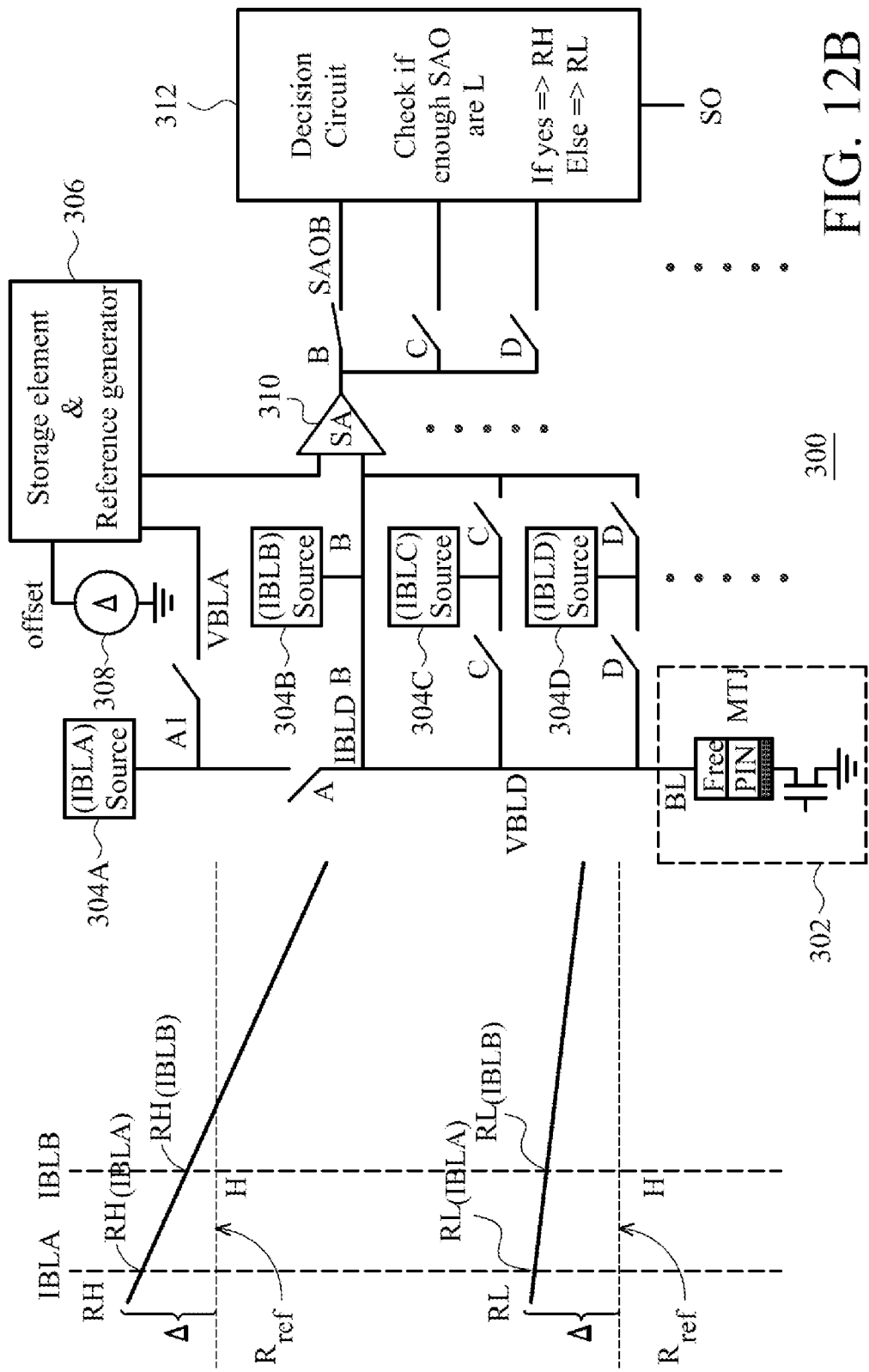

Turning to FIG. 12B, in a next operation switches A and A1 are off, switches B are now on, and switches C and D remain off. This configuration connects current source 304B to the memory cell 302 to provide sensing current IBLB. This generates voltage VVLB, which is equal to either IBLB×$RH_{(IBLB)}$ or IBLB×$RL_{(IBLB)}$. Recall that IBLB is larger than IBLA and that the resistance of the MRAM cell goes down as the sensing current increases. Recall also that if the memory cell is programmed at RH, the amount of drop off from $RH_{(IBLA)}$ to $RH_{(IBLB)}$ will be steeper than the amount of drop off from $RL_{(IBLA)}$ to $RL_{(IBLB)}$. As such the resistance value of the cell is closer to Rref at this point if the cell is programmed at RH than if programmed at RL. In any event, given the value set for IBLB in this illustration, both $RH_{(IBLB)}$ and $RL_{(IBLB)}$ are greater than Rref, meaning VBLB is greater than VBLA-offset. Therefore, sense amplifier 310 outputs a logical "1" for SAOB, which is stored by decision circuit 312 for later analysis.

Figure 12C:
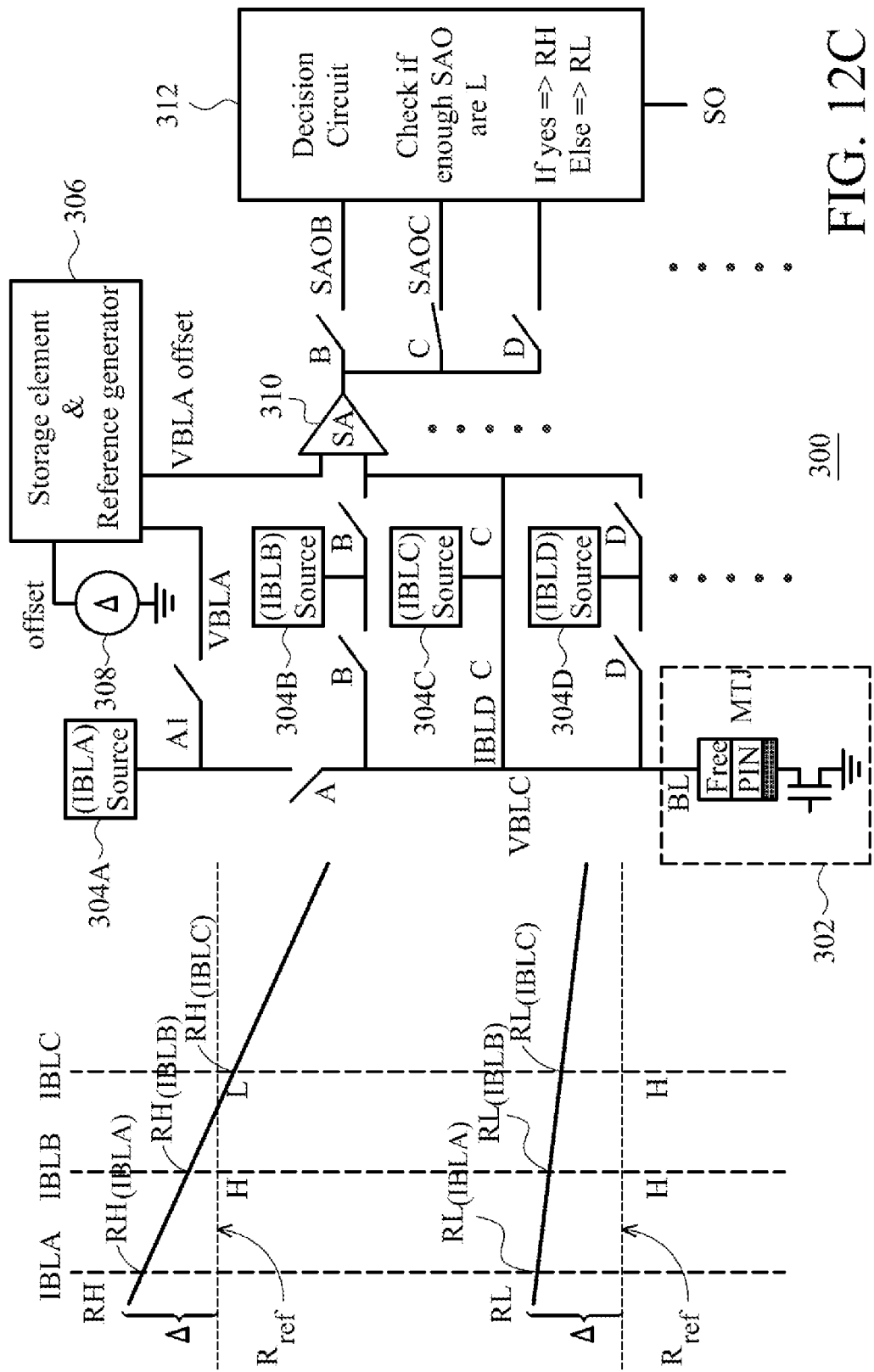

Turning to FIG. 12C, in a next operation switches A, A1 and B are off, switches C are now on, and switches D remain off. This configuration connects current source 304C to the memory cell 302 to provide sensing current IBLC. This generates voltage VBLC, which is equal to either IBLC×$RH_{(IBLC)}$ or IBLC×$RL_{(IBLC)}$. Recall that IBLC is larger than IBLB and that the resistance of the MRAM cell goes down as the sensing current increases. Recall also that if the memory cell is programmed at RH, the drop off from $RH_{(IBLB)}$ to $RH_{(IBLC)}$ will be steeper than the drop off from $RL_{(IBLB)}$ to $RH_{(IBLC)}$. As such and as shown in the graph to the left of the circuit 300, the resistance value of the cell is actually lower than Rref at this point if the cell is programmed at RH but still above Rref if programmed at RL. VBLC is lower than VBLA-offset if the MRAM cell is programmed at RH, and VBLC is higher than VBLA-offset if the MRAM cell is programmed at RL. Therefore, sense amplifier 310 outputs a logical "0" for SAOB if the cell is at RH and a logical "1" if the cell is at RL.

Figure 12D:
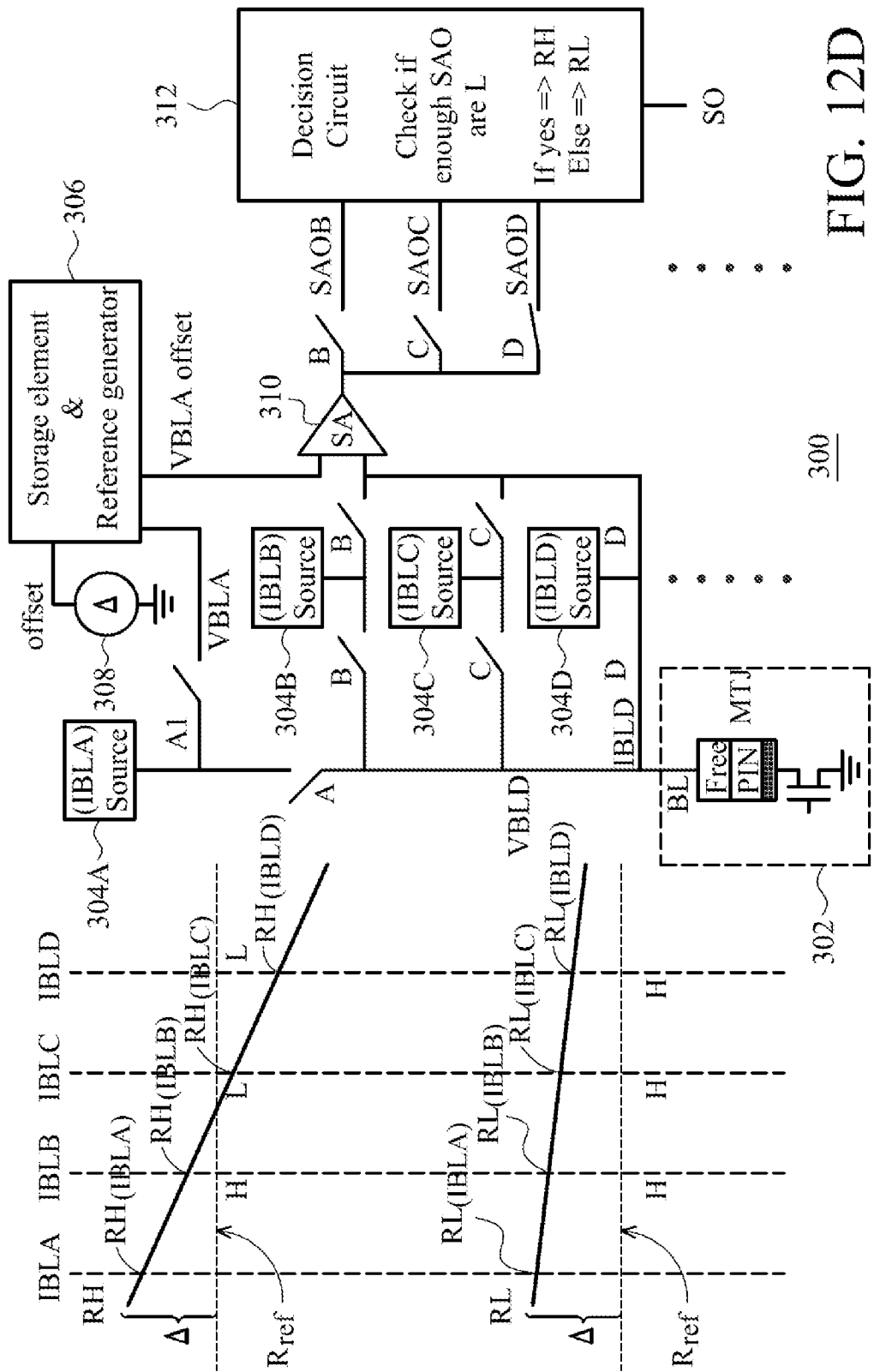

Turning finally to FIG. 12D, in a next operation switches A, A1, B and C are off and switches D are now on. This configuration connects current source 304D to the memory cell 302 to provide sensing current IBLD. This generates voltage VBLD, which is equal to either IBLD×$RH_{(IBLD)}$ or IBLD×$RL_{(IBLD)}$. Recall again that IBLD is larger than IBLC and that the resistance of the MRAM cell goes down as the sensing current increases. Recall also that if the memory cell is programmed at RH, the drop off from $RH_{(IBLC)}$ to $RH_{(IBLD)}$ will be larger than the drop off from $RL_{(IBLC)}$ to $RL_{(IBLD)}$. As such and as shown in the graph to the left of the circuit 300, the resistance value of the cell is again lower than Rref at this point if the cell is programmed at RH and notably still above Rref if programmed at RL. VBLD is lower than VBLA-offset if the MRAM cell is programmed at RH, and VBLD is higher than VBLA-offset if the MRAM cell is programmed at RL. Therefore, sense amplifier 310 outputs a logical "0" for SAOB if the cell is at RH and a logical "1" if the cell is at RL.

The value of the offset Δ and the number of sensing currents (and thus the number of data points) and their spacing can be selected to provide data from which the programmed state of the memory cell can be definitively determined. In embodiments, at least four sensing currents are used, which is sufficient for generating the reference voltage and three data points SAOB, SAOC and SAOD, and the values are selected such that there will be at least two data points that would differ between a cell programmed at RH and one programmed at RL. At least two differences are deemed preferable to avoid instances when the RH value may fall at or near Rref. In the present example, RH may be represented by outputs [1 0 0] and RL by outputs [1 1 1].

The decision circuit 312 is configured to analyze the outputs SAOB, SAOC, SAOD, etc. and output a sense output SO that is either logical high ("1") or logical low ("0") dependent on the data. The circuit can be configured in any number of ways to make this determination. For example, the circuit can be configured to check to see if there are enough SAO outputs that are low to make a determination that the cell is programmed at RH and output a logical "0" in such case (assuming of course that the convention is that RH corresponds to logical "0"). One may not expect the same output data pattern for each cell examined since process variations may affect the slope of RH an RL slightly. This can be accounted for by carefully choosing the value of delta, the number of sensing currents (and thus data points) and the spacing between the data points. In any event, values should be adopted such that the number of high output data points should always be more when reading a cell programmed at RL than if reading a cell programmed at RH.

Although the read architecture has been described above in connection with setting of a sense threshold voltage based on subtracting an offset voltage from VBLA, which is generated using low reference current IBLA, the system may in essence be flipped, meaning the sense threshold voltage is based on adding an offset voltage from VBLD, which is generated using higher reference current IBLD. Voltages VBLA, VBLB and VBLC would then be compared to this VBLD-offset voltage threshold instead of VBLA-offset.

Further, as described above, the current sources 304 can be replaced with voltage sources. In this embodiment of the read architecture, the read architecture fundamentally operates in the same way but uses current sense amplifier (rather than a voltage sense amplifier) and current reference (rather than voltage reference VBLA-offset).

In embodiments, the reference generator described above can be configured as a simple capacitor for storing a voltage value VBLA-offset, which is generated by connecting the voltage VBLA to the offset 308. In embodiments, conventional charge sharing techniques using switching capacitors may be employed. The VBLA voltage is stored at a first capacitor and then the first capacitor is connected to a second, smaller capacitor for charge sharing with the second capacitor. A smaller voltage is therefore generated by the smaller charge in the second capacitor. The value of delta can be easily controlled through the sizing of the capacitors.

Figure 13:
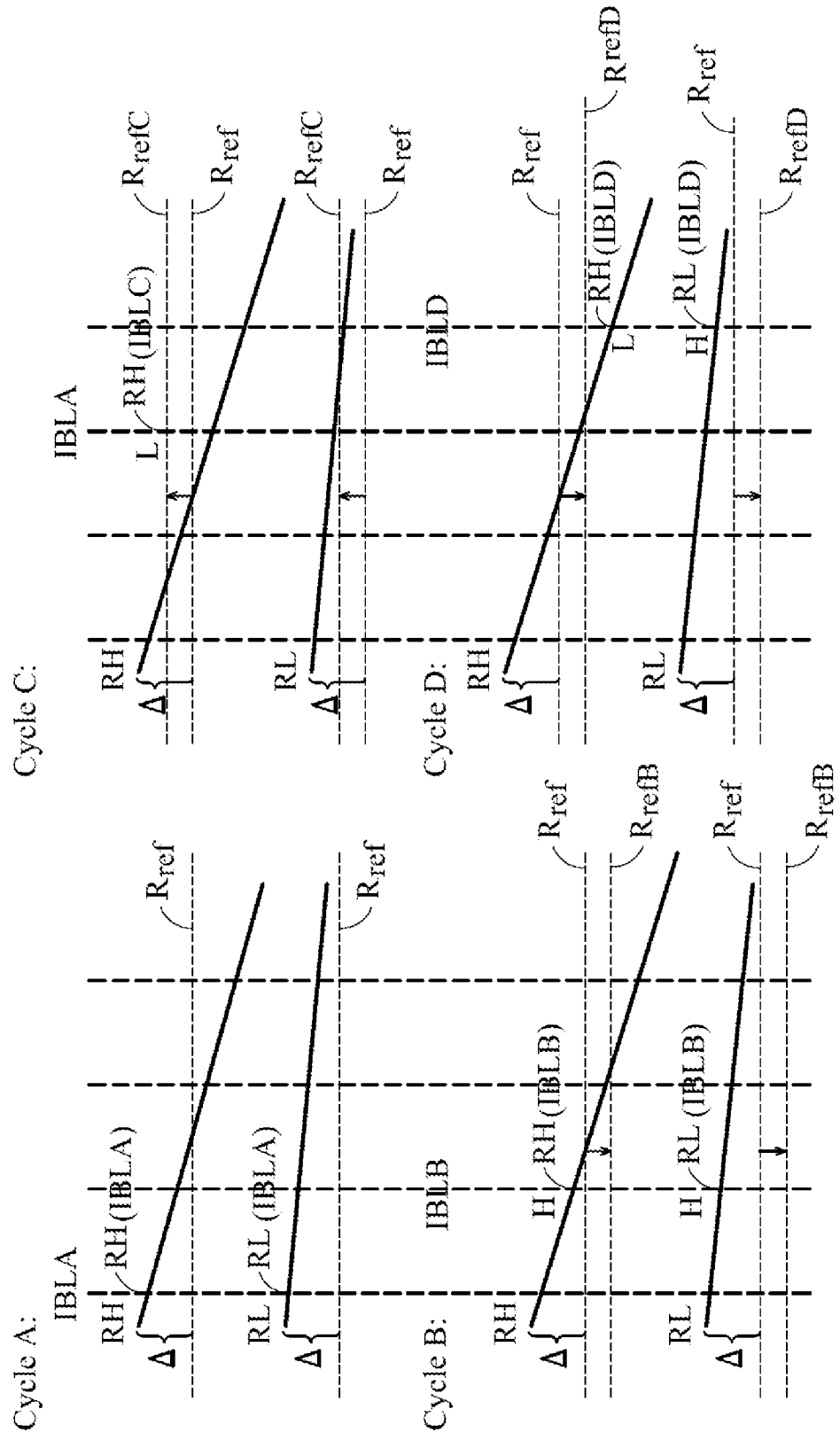
FIG. 13 illustrates an alternative embodiment of a non-destructive read methodology.

FIGS. 13 and 14 illustrate an alternative embodiment of the read architecture and method described above in connection with FIGS. 12-12D. In this approach, to improve the sensing margin, the offset (Δ) is moved up and down for the sequential read. With reference to FIG. 13, FIG. 13 shows four cycles using reference currents IBLA, IBLB, IBLC and IBLD. These four cycles are described above in connection with FIGS. 12-12D. As can be seen from FIG. 13, at cycle 13 the value of reference Rref threshold is lowered to RrefB. For cycle C, the value of the reference Rref threshold is raised above the original Rref value to Rref C. Finally, for Cycle D, the value of the Rref threshold is lowered to Rref D, which is below the original Rref value. The difference reference values can be generated in any number of ways. For example, a voltage divider or current mirror may be used to provide different delta values for use in providing the different reference thresholds.

For Cycle B, moving the offset as described above enlarges the difference between RH/RL and Rref, increasing the read margin for both read RH and read RL. In Cycle C, reducing the offset to raise the threshold point enlarges the sense amplifier margin for a read RH but reduces the margin for a read RL.

The change in the delta value can depend on the feature of the sense amplifier. For example, it may be easier for some sense amplifiers to read RL or RH, so the offset can be tuned for different purposes. For example, some sense amplifiers (or sensing architectures) might prefer to read RL but not to read RH, in which case more margin should be preserved for RH.

This embodiment of the non-destructive read method is illustrated in the flow diagram of FIG. 14. At step 400, the offset voltage (or current as the case may be) is generated. At step 402, the first sense current I_blA (or voltage) is forced on the MRAM cell. At step 404, the resultant bit line voltage (or current) plus the generated offset are stored as the reference threshold. At step 406, the next sense current (or voltage) is forced on the cell and the sense results are stored. At step 408, the sense ratio of the sense amplifier is changed, such as by changing the offset voltage (or current). Step 406 is then repeated with the next sense current. Steps 406 and 408 can be repeated until all sense currents are used. At step 410, the stored sense outputs are examined to see how many outputs are low (or high depending on the selected approach). If the result of step 410 is negative, then at step 412 is determined that the cell was programmed at RL. Otherwise, at step 414 it is determined that the cell was programmed at RH.

It should be appreciated that while the destructive read architecture and methodology described above is illustrated in connection with MRAM cells, such as STT-MRAM cells, the approach described herein can be applied to reading other types of memory cells where process variations may lead to overlaps in the distribution of logical high and logical low cell characteristics, meaning a single sense threshold may not provide universally accurate results. Likewise, it should be appreciated that the non-destructive read architecture and methodology is not limited in use to STT-MRAM but also may be used in other types of MRAM.

As described herein, in one embodiment of a read architecture for reading random access memory (RAM) cells, the architecture includes a multi-level sense amplifier, the multi-level sense amplifier including a plurality of sense amplifiers, each sense amplifier having a respective sense threshold and a respective sense output, and a storage module coupled to the multi-level sense amplifier for storing the sense outputs of the multi-level sense amplifier. The storage module stores a first set of sense outputs corresponding to a first read of an RAM cell and stores a second set of sense outputs corresponding to a second read of the RAM cell. The architecture also includes a decision module for comparing the first and second set of sense outputs and determining a data state of the RAM cell based on the comparison.

As also described herein, a method of reading a magnetoresistive random access memory (RAM) cell includes the steps of: performing a first read of the RAM cell at each of a plurality of different sense thresholds to provide a first set of sense outputs; writing the RAM cell to the low resistance state; performing a second read of the RAM cell at each of the plurality of different sense thresholds to provide a second set of sense outputs; comparing the first set of sense outputs and second set of sense outputs; and providing a data output for the RAM cell based on the comparing step.

In an embodiment of a non-destructive method of reading a magnetoresistive random access memory (MRAM) cell, the method includes the steps of: providing a first stimulus to the MRAM cell to produce a first bit line electric quantity; deriving a reference quantity from the first bit line electric quantity; providing a plurality of additional stimuli to the MRAM cell in sequence to produce a corresponding plurality of bit line electric quantities; comparing the reference quantity with the plurality of bit line electric quantities in sequence to produce a corresponding plurality of output values representing a result of the comparison; and examining the plurality of output values and outputting a sense output representing a determination of a programmed state of the MRAM cell.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A read architecture for reading random access memory (RAM) cells, comprising:
   a multi-level sense amplifier, the multi-level sense amplifier comprising a plurality of sense amplifiers, each sense amplifier having a respective sense threshold and a respective sense output;
   a storage module coupled to the multi-level sense amplifier for storing the sense outputs of the multi-level sense amplifier, the storage module storing a first set of sense outputs corresponding to a first read of a RAM cell and storing a second set of sense outputs corresponding to a second read of the RAM cell; and
   a decision module for comparing the first and second set of sense outputs and determining a data state of the RAM cell based on the comparison.

2. The read architecture of claim 1, wherein the RAM cell is programmable to a high resistance state and a low resistance state, wherein the RAM cell is programmed to a low resistance state for the second read.

3. The read architecture of claim 2, wherein the sense thresholds are selected such that at least two sense outputs change between the first read and the second read when the RAM cell is programmed in the high resistance state for the first read.

4. The read architecture of claim 2, wherein the sense thresholds of the sense amplifiers are spaced from one another such that adjacent sense thresholds are separated from one another by a value corresponding to less than half of a difference between the resistance values of the high and low resistance states.

5. The read architecture of claim 4, wherein the RAM cell is part of an array of RAM cells having a distribution of high resistance state values and low resistance state values, wherein the multi-level sense amplifier comprises at least two sense amplifiers with sense thresholds set below a value corresponding to a lowest one of the high resistance state values and at least two sense amplifiers with sense thresholds set above a value corresponding to a highest one of the low resistance state values.

6. The read architecture of claim 1, wherein the multi-level sense amplifier comprises:
   a reference circuit for providing a reference current, wherein each sense amplifier is configured to mirror the reference current at a different current ratio; and
   means for establishing a cell current in the RAM cell;
   wherein each the sense amplifier is responsive to the cell current and a respective mirrored reference current to provide a respective sense output indicative of whether the cell current is above or below the respective mirrored reference current.

7. The read architecture of claim 6, wherein the reference circuit includes a reference resistor for setting a value of the reference current.

8. The read architecture of claim 1, wherein the storage module comprises a first set of data latches for storing the first set of sense outputs; a second set of data latches for storing the second set of sense outputs; and a multiplexor circuit for selectively passing the first set of sense outputs and second set of sense outputs to the first and second sets of data latches, respectively.

9. The read architecture of claim 1, wherein the decision module comprises a set of XOR gates for comparing the first and second sets of sense outputs.

10. The read architecture of claim 1, wherein the RAM cell is a magnetoresistive RAM (MRAM) cell.

11. A method of reading a random access memory (RAM) cell, wherein the RAM cell is programmable to a high resistance state and a low resistance state comprising the steps of:
    performing a first read of the RAM cell at each of a plurality of different sense thresholds to provide a first set of sense outputs;
    writing the RAM cell to the low resistance state;
    performing a second read of the RAM cell at each of the plurality of different sense thresholds to provide a second set of sense outputs;
    comparing the first set of sense outputs and second set of sense outputs; and
    providing a data output for the RAM cell based on the comparing step.

12. The method of claim 11, further comprising the step of after performing the second read writing the RAM cell to a high resistance state if the data output for the RAM cell corresponds to the high resistance state.

13. The method of claim 11, further comprising the step of determining if the first and second sets of sense outputs differ by at least a predetermined number of individual sense outputs,
    wherein the data output corresponds to a logical value associated with the high resistance state only if the first and second sets of sense outputs differ by at least the predetermined number.

14. The method of claim 13, wherein the predetermined number is 2.

15. The method of claim 14, wherein the sense thresholds are spaced from one another such that adjacent sense thresholds are separated from one another by a value corresponding to less than half of a difference between the resistance values of the high and low resistance states.

16. The method of claim 15, wherein the RAM cell is part of an array of RAM cells having a distribution of high resistance state values and low resistance state values, wherein at least two of the sense thresholds are set below a value corresponding to a lowest one of the high resistance state values and at least two of the sense thresholds are above a value corresponding to the highest one of the low resistance state values.

17. The method of claim 11, wherein the RAM cell is a magnetoresistive RAM (MRAM) cell.

18. A non-destructive method of reading a magnetoresistive random access memory (MRAM) cell, wherein the MRAM cell is programmable to a high resistance state and a low resistance state, comprising the steps of:
    providing a first stimulus to the MRAM cell to produce a first bit line electric quantity;
    deriving a reference quantity from the first bit line electric quantity;
    providing a plurality of additional stimuli to the MRAM cell in sequence to produce a corresponding plurality of bit line electric quantities;
    comparing the reference quantity with the plurality of bit line electric quantities in sequence to produce a corresponding plurality of output values representing a result of the comparison; and examining the plurality of output values and outputting a sense output representing a determination of a programmed state of the MRAM cell.

19. The non-destructive method of reading of claim 18,
wherein the first and additional stimuli are cell biasing currents and the first bit line electric quantity and corresponding plurality of bit line electric quantities are bit line voltages, the reference quantity is a reference voltage; and the comparing step is performed by a voltage sense amplifier, or wherein the first and additional stimuli are cell biasing voltages and the first bit line electric quantity and corresponding plurality of bit line electric quantities are bit line currents, the reference quantity is a reference current, and the comparing step is performed by a current sense amplifier.

20. The non-destructive method of reading of claim 18, wherein the reference quantity is offset from the first bit line electric quantity by a predetermined offset value, wherein the predetermined offset is selected such that a greater number of the corresponding plurality of bit line electric quantities fall below the reference quantity when the MRAM cell is programmed at the high resistance state than when programmed at the low resistance state.

21. The non-destructive method of reading of claim 18, further comprising the step of changing the reference quantity before comparing the reference quantity with at least one of the plurality of bit line electric quantities.

22. The non-destructive method of reading of claim 18, wherein the MRAM cell is a Spin-Transfer-Torque MRAM cell or toggle mode MRAM cell.

23. The non-destructive method of reading of claim 18, wherein the plurality of additional stimuli are a plurality of different cell biasing currents or cell biasing voltages.

* * * * *